United States Patent
Tanaka et al.

(10) Patent No.: US 7,897,509 B2
(45) Date of Patent: Mar. 1, 2011

(54) SEMICONDUCTOR WAFER AND METHOD OF MANUFACTURING THE SAME AND METHOD OF MANUFACTURING SEMICONDUCTOR DEVICE

(75) Inventors: Naotaka Tanaka, Kasumigaura (JP);
Kenji Kanemitsu, Hitachinaka (JP);
Takafumi Kikuchi, Kikuchi (JP);
Takashi Akazawa, Musashimurayama (JP)

(73) Assignee: Renesas Electronics Corp., Tokyo (JP)

( * ) Notice: Subject to any disclaimer, the term of this patent is extended or adjusted under 35 U.S.C. 154(b) by 0 days.

(21) Appl. No.: 12/823,913

(22) Filed: Jun. 25, 2010

(65) Prior Publication Data
US 2010/0258948 A1  Oct. 14, 2010

Related U.S. Application Data

(62) Division of application No. 11/891,458, filed on Aug. 10, 2007, now abandoned.

(30) Foreign Application Priority Data

Sep. 28, 2006  (JP) ................. 2006-265873

(51) Int. Cl.
*H01L 21/4763* (2006.01)

(52) U.S. Cl. ... 438/637; 438/612; 438/645; 257/E23.175
(58) Field of Classification Search .......... 438/612, 438/618, 626, 637, 645; 257/E23.175
See application file for complete search history.

(56) References Cited

U.S. PATENT DOCUMENTS

| 7,732,925 B2 * | 6/2010 | Okayama et al. ............. 257/774 |
| 2003/0222354 A1 * | 12/2003 | Mastromatteo et al. ...... 257/774 |
| 2006/0060945 A1 | 3/2006 | Cho et al. |

* cited by examiner

*Primary Examiner* — David A Zarneke
*Assistant Examiner* — Jenny L Wagner
(74) *Attorney, Agent, or Firm* — Kilpatrick Townsend & Stockton LLP

(57) ABSTRACT

A semiconductor wafer comprising: a tubular trench formed at a position to form a through-hole electrode of a wafer; an insulating member buried inside the trench and on an upper surface of the trench; a gate electrode film and a metal film formed on an upper surface of the insulating member; a multilevel columnar wiring via formed on an upper surface of the metal film; and an external connection electrode formed electrically connected to the metal film via the multilevel columnar wiring via. In this manner, it is unnecessary to have a new process of dry etching to form a through-hole electrode after thinning the wafer and equipment development. Moreover, introduction of a specific design enables formation of through-hole electrodes with significantly reduced difficulties of respective processes.

6 Claims, 20 Drawing Sheets

FIG. 3
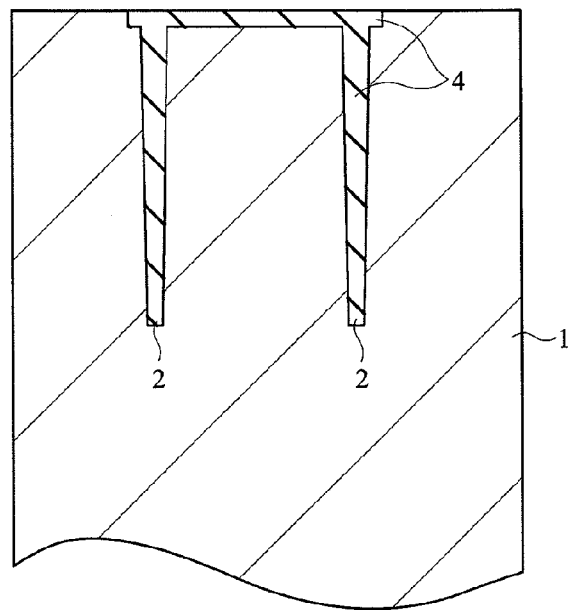
FIG. 4A
FIG. 4B
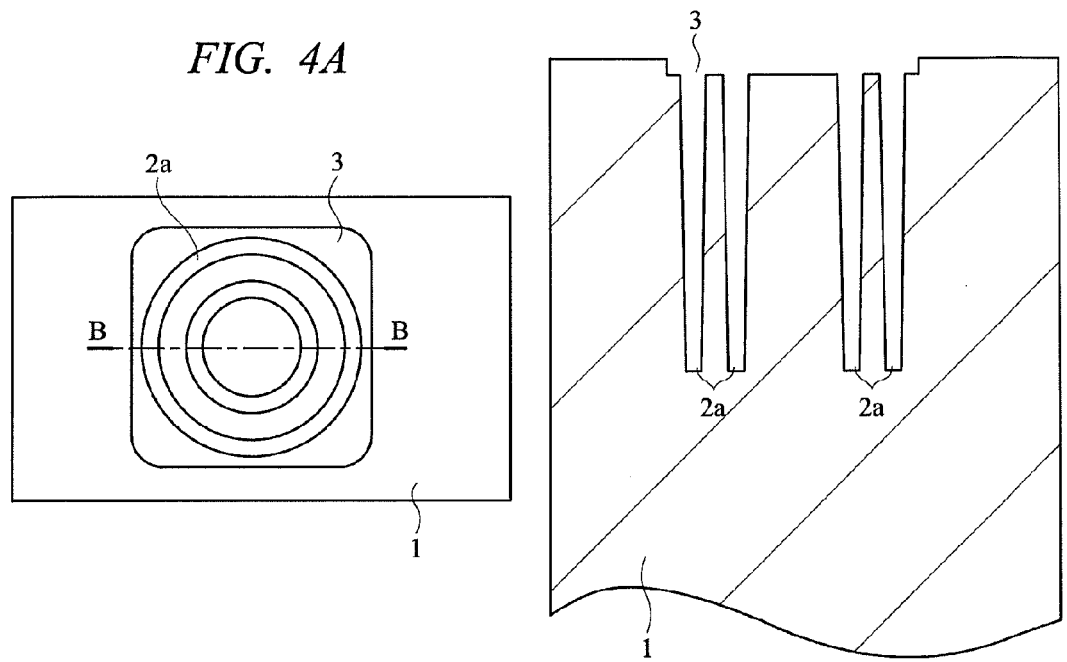

SEMICONDUCTOR WAFER AND METHOD OF MANUFACTURING THE SAME AND METHOD OF MANUFACTURING SEMICONDUCTOR DEVICE

CROSS-REFERENCE TO RELATED APPLICATION

The present application is a Divisional Application of U.S. patent application Ser. No. 11/891,458, filed on Aug. 10, 2007, which claims priority from Japanese Patent Application No. JP 2006-265873 filed on Sep. 28, 2006, the content of both of which are hereby incorporated by reference into this application for all purposes.

TECHNICAL FIELD OF THE INVENTION

The present invention relates to a technique for manufacturing a semiconductor wafer and a semiconductor device. More particularly, the present invention relates to a technique effectively applied to a configuration of through-hole electrodes formed inside a plurality of semiconductor chips that are three-dimensionally stacked and a method of manufacturing the same.

BACKGROUND OF THE INVENTION

In recent years, system-in-package technology which realizes a high-performance system in a short period by high-densely packaging a plurality of semiconductor chips having integrated circuits mounted thereon attracts attention, and manufacturers respectively suggest various packaging structures. Particularly, stacked package which can significantly make the size smaller by three-dimensionally stacking a plurality of semiconductor chips has actively developed.

For example, as disclosed in Japanese Patent Application Laid-Open Publication No. 11-204720 (Patent Document 1), the three-dimensionally stacked semiconductor chips and the package substrate are electrically connected mainly by wire bonding. Therefore, the upper chip of the stacked semiconductor chips is required to be smaller than the lower chip. When chips having similar sizes are stacked, it is required to ensure wire-bonding areas by forming a structure with spacers between chips. This kind of electrical connection of wire bonding has high degree of freedom in routing and so it is a very effective way to realize electrical connections between a plurality of semiconductor chips in short TAT (Turn Around Time) and at low cost.

However, in wire bonding connection, it is required to bond all of the wirings from a plurality of chip electrodes to the package substrate once and then wiring again to another chip. Accordingly, there have been problems of very long connection length between chips and of very high density of wiring on the package substrate. Due to the problems, inductance between chips increases so that high-speed transmission gets to be difficult. And moreover, yield is reduced as density on the package substrate gets higher, and the substrate cost may be increased.

For these problems in wire bonding, a method to form electrodes penetrating through the chip and connect upper and lower chips is suggested. For example, Japanese Patent Application Laid-Open Publication No. 2004-342990 (Patent Document 2) discloses a method to form through-hole electrodes of plate-filing type from the back surface of wafer with respect to a semiconductor wafer fixed on a holding member and thinned. Japanese Patent Application Laid-Open Publication No. 2005-340389 (Patent Document 3) discloses a structure in which through-hole electrodes in hole-shape without filling plate from the back surface of wafer are formed and metal bumps are mechanically pressurized and filled inside the holes to connect chips.

SUMMARY OF THE INVENTION

As described above, a method using wire bonding is the main stream as a method of packaging a plurality of semiconductor chips stacked three-dimensionally. Meanwhile, it is predicted that, in the future, the wiring length will be a bottleneck to high-speed transmission, and ensuring bonding area will be a bottleneck to smaller and thinner packages.

For these problems, a method of three-dimensional interconnection between chips by shortest-length wiring using through-hole electrodes is suggested. Meanwhile, in the process to form through-hole electrodes through silicon, as represented by dry etching to form through-hole portions, it requires to develop a new process which hasn't existed in the past packaging process. Consequently, as compared to conventional three-dimensional packages using wire bonding, manufacturing cost of the above process increases, and moreover, following new facility development and infrastructure building. They are major heavy drags on practical application.

Further, the method disclosed in the Patent Document 2 to form electrodes of plate-filling type by developing plating on through-holes in the chip has, normally, a problem of considerable time required for the plating development (over a few hours) and a problem of technical difficulty in uniform development including that on through-holes with high aspect ratio.

Still further, although the method disclosed in the Patent Document 3 simplifies the process in view of omitting filling of plating, it has the same problem of necessity of new process development such as dry etching.

In consideration of these problems described above, an object of the present invention is to clear these problems described above to the fullest extent so as to provide a semiconductor wafer capable of forming through-hole electrodes therein at low cost and in short TAT and applicable for large-sized wafers and a structure of a semiconductor device and a method of manufacturing the same.

The above and other objects and novel characteristics of the present invention will be apparent from the description of this specification and the accompanying drawings.

The typical ones of the inventions disclosed in this application will be briefly described as follows.

(1) A semiconductor wafer of the present invention includes: a trench of tubular shape formed at a position to form a through-hole electrode of a silicon wafer; an insulating member buried inside and on an upper surface of the trench; a conducting film formed on an upper surface of the insulating member; a conducting member formed on an upper surface of the conducting film; and an external connection electrode formed electrically connected to the conducting film via the conducting member.

And, a method of manufacturing a semiconductor wafer of the present invention includes the steps of: forming a trench of tubular shape at a position to form a through-hole electrode of a silicon wafer; burying an insulating member inside and on an upper surface of the trench; forming a conducting film on an upper surface of the insulating member; and forming an external connection electrode electrically connected to the conducting film via the conducting member.

Further, a method of manufacturing a semiconductor device of the present invention using the semiconductor wafer includes the steps of: thinning the semiconductor wafer from its back surface and exposing the insulating member buried inside the trench; dissolving the insulating member inside and on the upper surface of the trench through wet etching; and forming a hole in silicon reaching the conducting film by dropping a piece of silicon of an inner surface side of the trench.

Alternatively, a method of manufacturing a semiconductor device of the present invention includes the steps of: forming a trench of tubular shape at a position to form a through-hole electrode of a silicon wafer; burying an insulating member inside and on an upper surface of the trench; forming a conducting film on an upper surface of the insulating member; forming a conducting member on an upper surface of the conducting film; forming an external connection electrode electrically connected to the conducting film via the conducting member; thinning the semiconductor wafer from a back surface thereof and exposing the insulating member buried inside the trench; dissolving the insulating member inside and on the upper surface of the trench through wet etching; forming a hole in silicon reaching the conducting film by dropping a piece of silicon of an inner surface side of the trench; forming an insulating film on the whole of the back surface of the silicon wafer and an inner surface of the hole in silicon; removing the insulting film only on a bottom part of the hole in silicon to expose the conducting film; and forming a seed layer for electrolytic plating and an electrolytic plating film in a predetermined area on the inner surface of the hole in silicon and the back surface of the silicon wafer so as to form a through-hole electrode electrically connected to the external connection electrode.

(2) A semiconductor wafer of the present invention includes: a trench of tubular shape formed at a position to form a through-hole electrode of a silicon wafer; an insulating member buried inside and on an upper surface of the trench; a conducting film formed on an upper surface of the insulating member; a conducting member formed on an upper surface of the conducting film; and an I/O wiring, power wiring, or ground wiring inside an LSI formed electrically connected to the conducting film via the conducting member.

And, a method of manufacturing a semiconductor wafer of the present invention includes the steps of: forming a trench of tubular shape at a position to form a through-hole electrode of a silicon wafer; burying an insulating member inside and on an upper surface of the trench; forming a conducting film on an upper surface of the insulating member; forming a conducting member on an upper surface of the conducting film; and forming an I/O wiring, power wiring, or ground wiring inside an LSI electrically connected to the conducting film via the conducting member.

Further, a method of manufacturing a semiconductor device of the present invention using the semiconductor wafer includes the steps of: thinning the semiconductor wafer from its back surface so as to expose the insulating member buried inside the trench; dissolving the insulating member inside and on the upper surface of the trench through wet etching; and forming a hole in silicon reaching the conducting film by dropping a piece of silicon of an inner surface side of the trench.

Alternatively, the method of manufacturing a semiconductor device of the present invention includes the steps of: forming a trench of tubular shape at a position to form a through-hole electrode of a silicon wafer; burying an insulating member inside and on an upper surface of the trench; forming a conducting film on an upper surface of the insulating member; forming a conducting member on an upper surface of the conducting film; forming an I/O wiring, power wiring, or ground wiring inside an LSI electrically connected to the conducting film via the conducting member; thinning the semiconductor wafer from its back surface so as to expose the insulating member buried inside the trench; dissolving the insulating member inside and on the upper surface of the trench through wet etching; forming a hole in silicon reaching the conducting film by dropping a piece of silicon of an inner surface side of the trench; forming an insulating film on an inner surface of the hole in silicon and whole of a back surface of the silicon wafer; removing the insulting film only on a bottom part of the hole in silicon so as to expose the conducting film; and forming a seed layer for electrolytic plating and an electrolytic plating film in a predetermined area on the inner surface of the hole in silicon and the back surface of the silicon wafer so as to form a through-hole electrode electrically connected to the external connection electrode.

The effects obtained by typical aspects of the present invention will be briefly described below.

According to the present invention, in cases where a through-hole electrode is formed from a back surface side of a wafer, it is possible to provide a semiconductor wafer capable of forming through-hole electrodes therein at low cost and in short TAT which is applicable even for large-sized wafers, and a structure of a semiconductor device and a method of manufacturing the same.

BRIEF DESCRIPTIONS OF THE DRAWINGS

FIG. 3 is a cross sectional view showing a manufacturing step (continued from FIG. 2) of the semiconductor wafer (main parts) according to the first embodiment of the present invention;

FIG. 4A is a plan view showing a manufacturing step of the semiconductor wafer (main parts of a modification example) according to the first embodiment of the present invention;

FIG. 4B is a cross sectional view of the semiconductor wafer shown in FIG. 4A cut along the cutting-plane line B-B;

Figure 28:
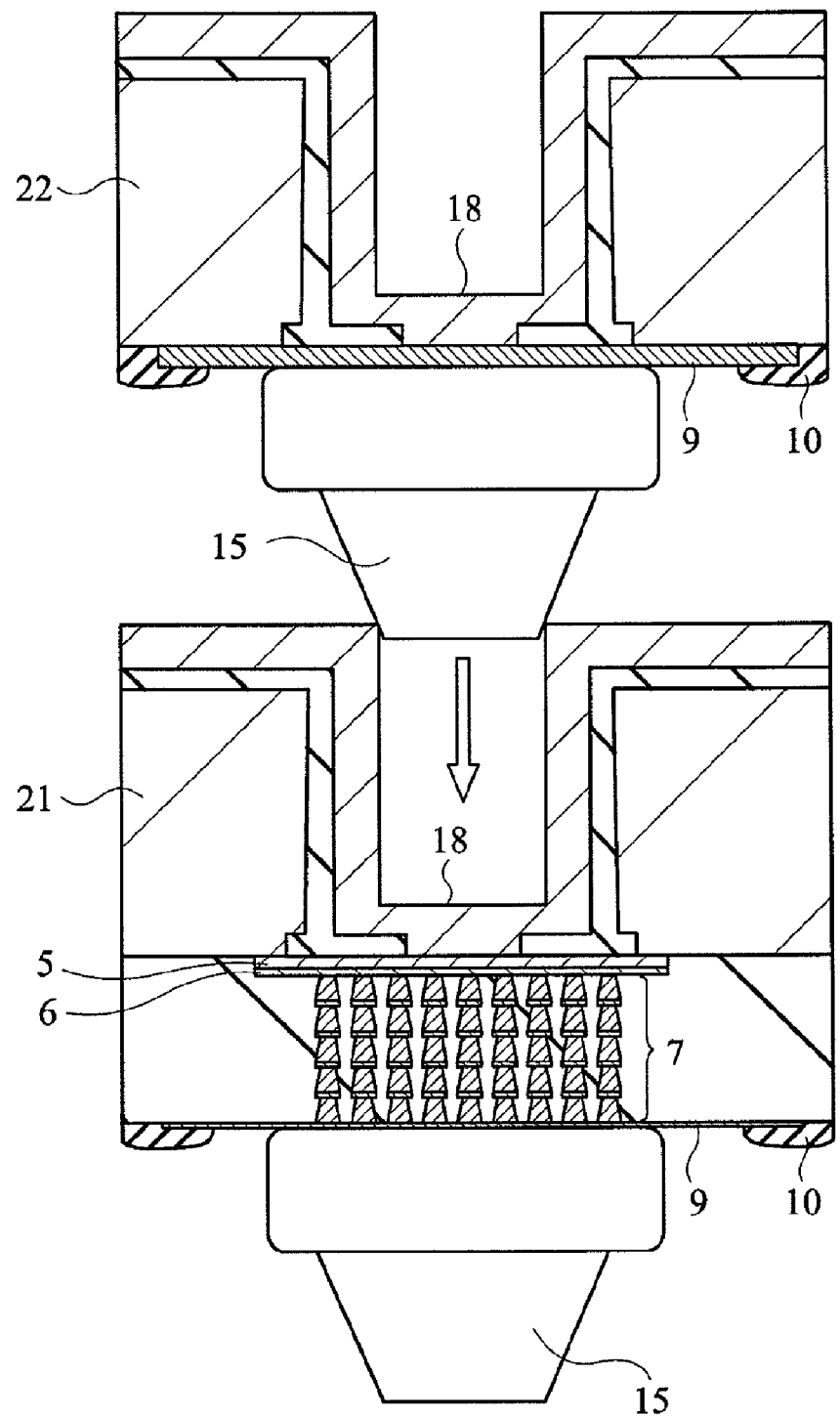
Figure 29:
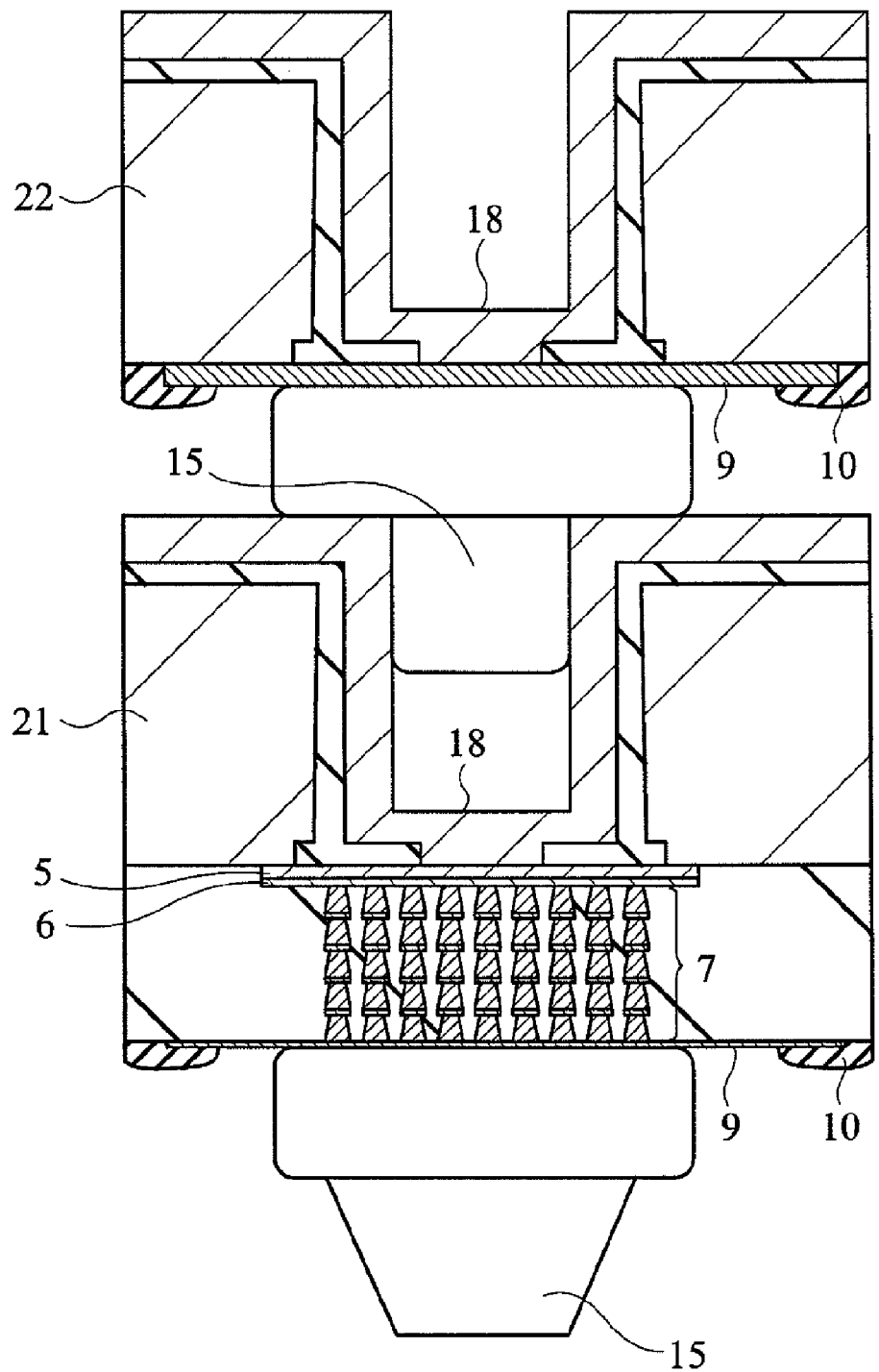

FIG. 28 is a diagram showing a method to electrically connect an LSI chip having a through-hole electrode and a stud bump of gold with an interposer chip formed according to the first to third embodiments of the present invention; and FIG. 29 is a diagram showing a method (continued from FIG. 28) to electrically connect the LSI chip having the through-hole electrode and the stud bump of gold with the interposer chip formed according to the first to third embodiments of the present invention.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Outline of Embodiments of the Present Invention

In the present invention, the initial stage of manufacturing an LSI includes the steps of: forming a trench of tubular shape (cylindrical and the like) at a position to form a through-hole electrode through dry etching; filling the trench part with an insulating material ($SiO_2$ and the like) through CVD and simultaneously insulating a surface of a substrate (Si substrate and the like); forming a Poly-Si film to form a gate electrode of a transistor and simultaneously forming a Poly-Si film also on a surface of the trench part; and forming a columnar wiring via on the Poly-Si film to electrically connect the Poly-Si film with an external connection electrode.

Further, the present invention includes the steps of: thinning a product wafer having trenches filled with the insulating material ($SiO_2$ and the like) described above by mechanical grinding (back grinding and the like) from a back surface side of the wafer fixed onto a holding member so as to expose the trench part described above from the back surface side; etching the exposed insulating material inside the trench by an etchant of the insulating material ($SiO_2$ and the like); and forming a through-hole without dry etching of silicon by dropping a piece of silicon inside of a portion surrounded by the tubular trench part.

Next, the present invention includes the steps of: forming an insulating film ($SiO_2$ and the like) by, for example, CVD on the whole surface of the back surface of the wafer with the through-hole formed therein; removing the insulating film only on a bottom part of the hole by wet etching on the insulating film of the bottom part of the hole after forming the insulating film described above; forming a through-hole electrode electrically connecting electrodes of front and back surfaces by forming an area including: the bottom part of the hole which includes the exposed part of the Poly-Si film described above electrically connected to the external connection electrode (Al electrode and the like) of the uppermost layer via the columnar wiring via; a sidewall part; and the back surface as a back-side plating electrode.

In the following, respective embodiments based on the outline of embodiments of the present invention are concretely described.

First Embodiment

Figure 1A:
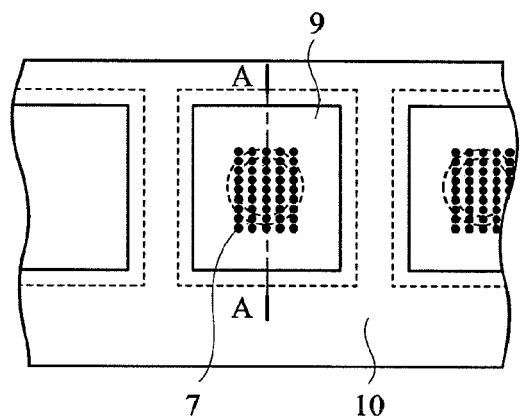
FIG. 1A is a plan view showing main parts of a semiconductor wafer according to a first embodiment of the present invention.
Figure 1B:
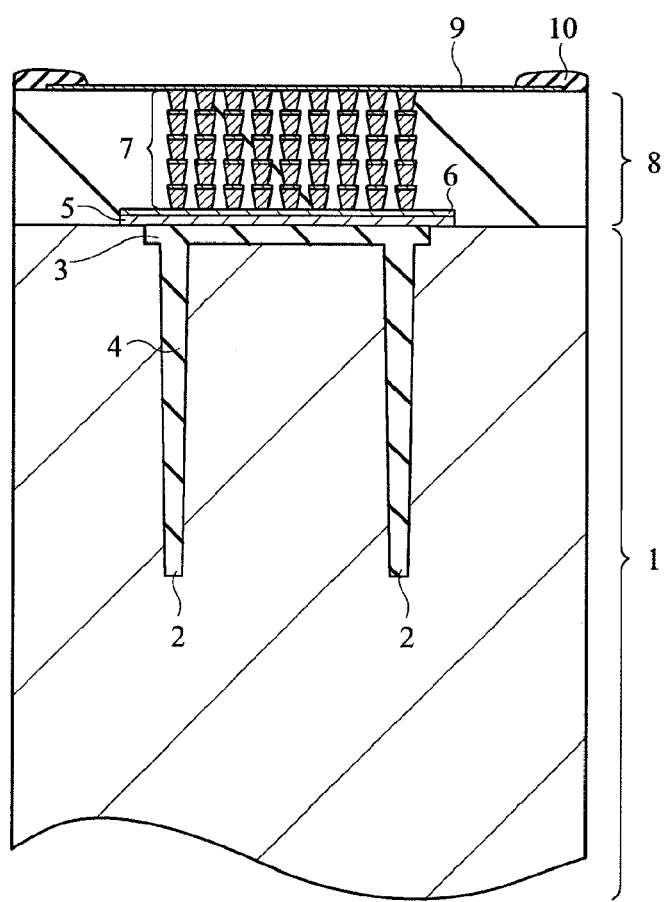
FIG. 1B is a cross sectional view of the semiconductor wafer shown in FIG. 1A cut along the cutting-plane line A-A.

FIG. 1 includes FIG. 1A of a plan view showing main parts of a semiconductor wafer according to a first embodiment of the present invention and FIG. 1B of a cross sectional view of FIG. 1A cut along the cutting-plane line A-A.

The semiconductor wafer of the present embodiment is also capable of being distributed as a product even in a form of semiconductor wafer other than manufacturing a semiconductor device as a product using the semiconductor wafer.

The semiconductor wafer of the present invention has, as shown in FIG. 1, a tubular deep trench 2 formed in a silicon (Si) substrate 1, and an insulating material 4 such as an oxide film which is an insulating member is filled inside and on an upper surface (field part 3) of the deep trench 2. The deep trench 2 is formed by dry etching, and the insulating material 4 is filled inside the tubular trench and the field part 3 by, for example, CVD. As an upper layer of the insulating material 4, a gate electrode film 5 such as a polycrystalline silicon (Poly-Si) film is formed and a metal film 6 such as tungsten (W) film is further formed as a conducting film. It is structured that the metal film 6 is electrically connected with an external connection electrode 9 such as aluminum (Al) electrode of the uppermost layer by a multi-layered (multilevel) columnar wiring via 7 as a conducting member. Although the columnar wiring via is formed simultaneously with a process to form an Al wiring or a process to form a Cu wiring process, it is not necessary to form all of the wirings with the same material, and it may be consolidated with a tungsten (W) via. Herein, other than the dry etching process to form the deep trench 2, processes till forming the columnar wiring via 7 are simultaneously performed in ordinary manufacturing steps of LSI.

FIG. 2 to FIG. 8 are diagrams (plan view, cross-sectional view) showing respective manufacturing steps of the semiconductor wafer (main parts) shown in FIG. 1.

Figure 2A:
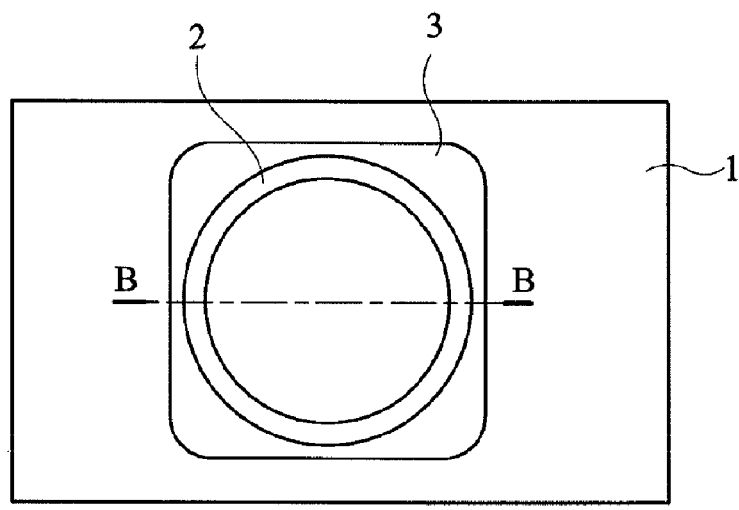
FIG. 2A is a plan view showing a manufacturing step of the semiconductor wafer (main parts) according to the first embodiment of the present invention.
Figure 2B:
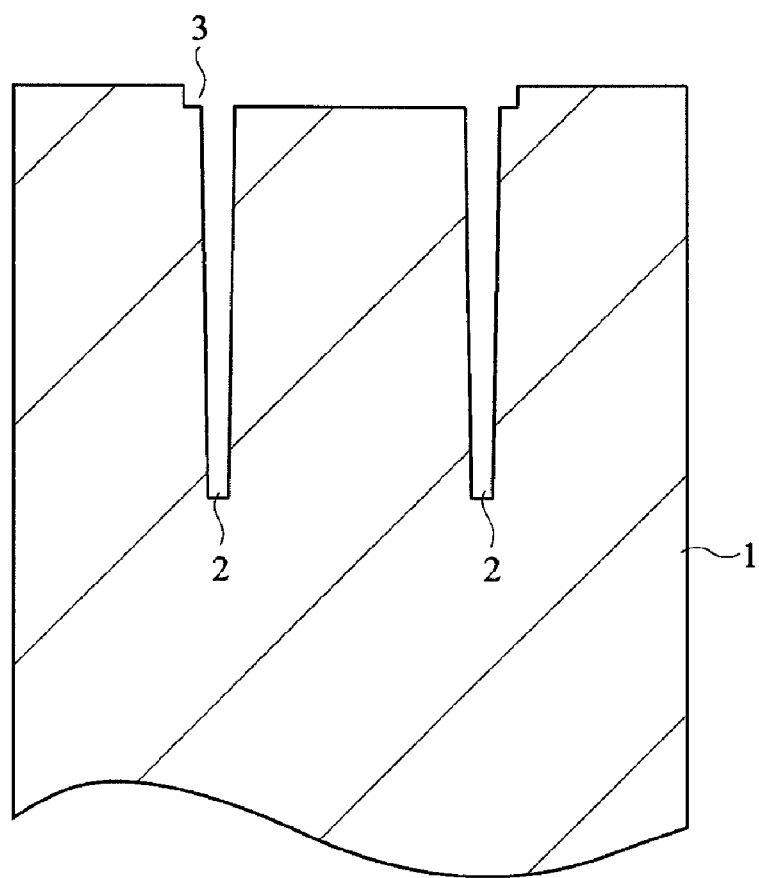
FIG. 2B is a cross sectional view of the semiconductor wafer shown in FIG. 2A cut along the cutting-plane line B-B.

As shown in FIG. 2 (FIG. 2A is a plan view, FIG. 2B is a cross sectional view along the cutting-plane line B-B), the field part (or active part) 3, which is normally formed on an isolation region, is formed on the silicon substrate 1 at a position and at the same time to form a through-hole electrode, and the cylindrical deep trench 2 is further formed. Herein, the outside diameter of the deep trench 2 corresponds to the outside diameter of the through-hole electrode to form. The depth of the deep trench 2 is about 50 to 70 μm, and it is sufficient as long as having a depth required to expose the trench part when thinning the wafer described below. Outline and width thereof depends on the size of the through-hole electrode to form. At present, the outermost diameter is about 20 to 30 μm, and the width of the trench part is about 5 to 7 μm.

Next, as shown in FIG. 3, the insulating material 4 is buried inside the deep trench 2 and on the field part 3 through, for example, CVD, and the surface is planarized by CMP process. Here, the insulating material 4 is not necessary to be completely filled inside the deep trench 2, and cavities and voids may be partly remained. This is caused by the etching process described below that results in dissolution of the buried insulating material 4. In addition, it is also effective to decrease stresses generated by thermal processes when cavities and voids are partly remained with respect to various thermal processes to be subjected in the following LSI manufacturing steps.

Figure 5A:
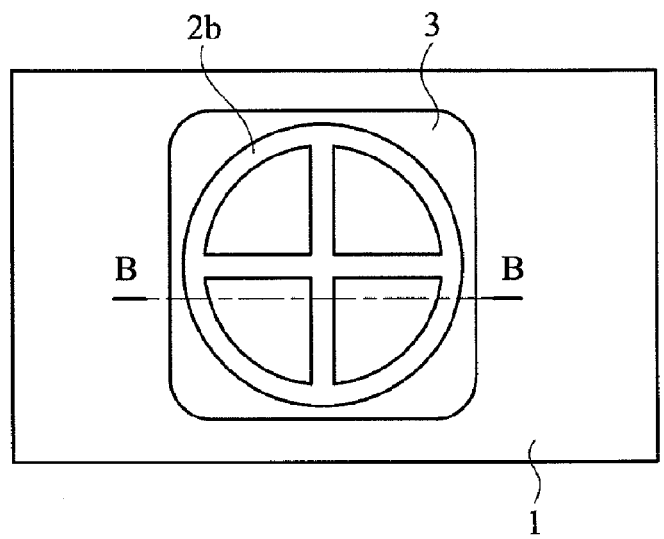
FIG. 5A is a plan view showing a manufacturing step of the semiconductor wafer (main parts of another modification example) according to the first embodiment of the present invention.
Figure 5B:
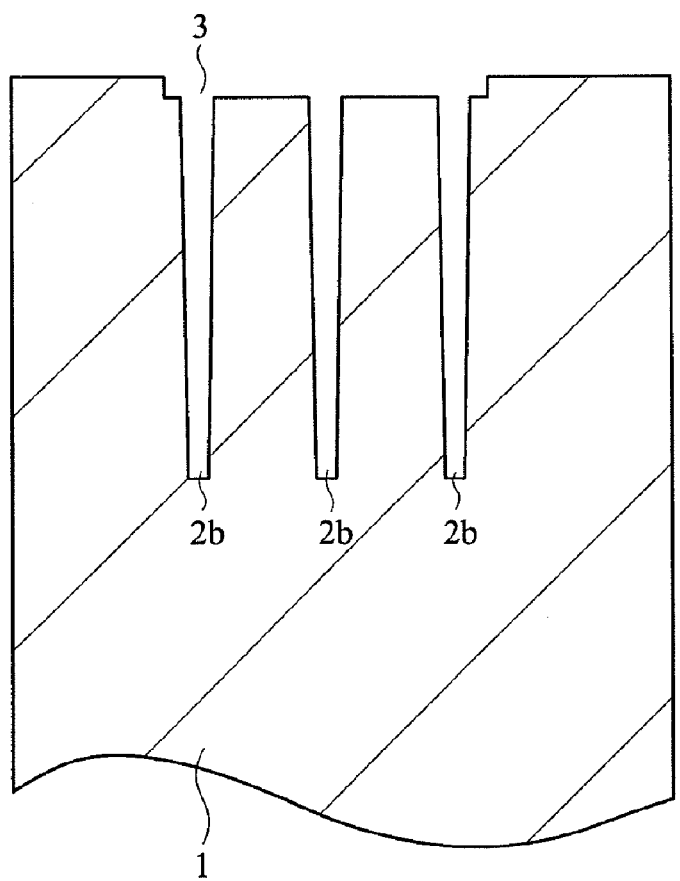
FIG. 5B is a cross sectional view of the semiconductor wafer shown in FIG. 5A cut along the cutting-plane line B-B.

Therefore, the shape of the deep trench 2 is not limited to tubular shape as shown in FIG. 2. A shape where a tubular deep trenches 2a are doubly formed as shown in FIG. 4 (FIG. 4A is a plan view, FIG. 4B is a cross-sectional view of FIG. 4A cut along the cutting-plane line B-B) and a shape where a deep trenches 2b in cross-shape are formed in conjunction as shown in FIG. 5 (FIG. 5A is a plan view, FIG. 5B is a cross-sectional view of FIG. 5A cut along the cutting-plane line B-B) are effective to improve a dissolution rate in the etching process described below. FIG. 4 and FIG. 5 are specific variations thereof.

Figure 6:
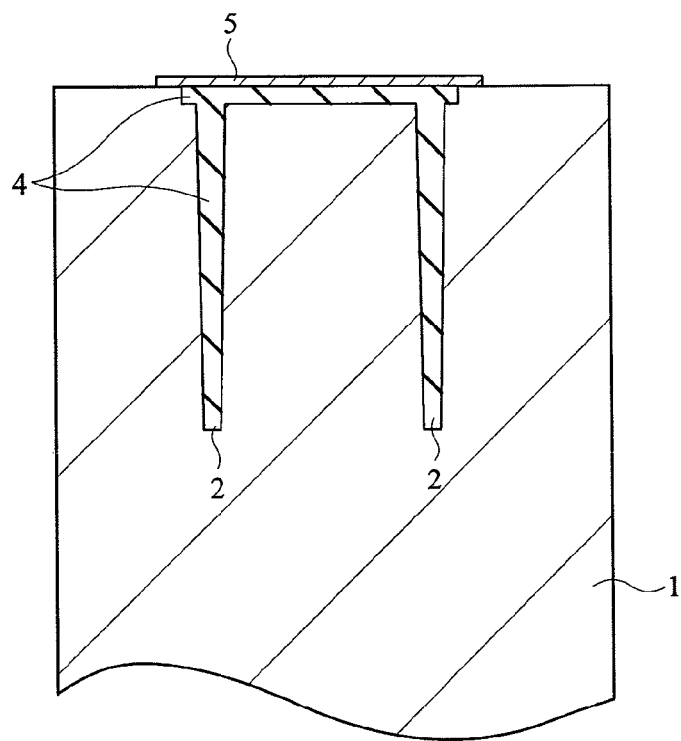
FIG. 6 is a cross sectional view showing a manufacturing step (continued from FIG. 3) of the semiconductor wafer (main parts) according to the first embodiment of the present invention.
Figure 7:
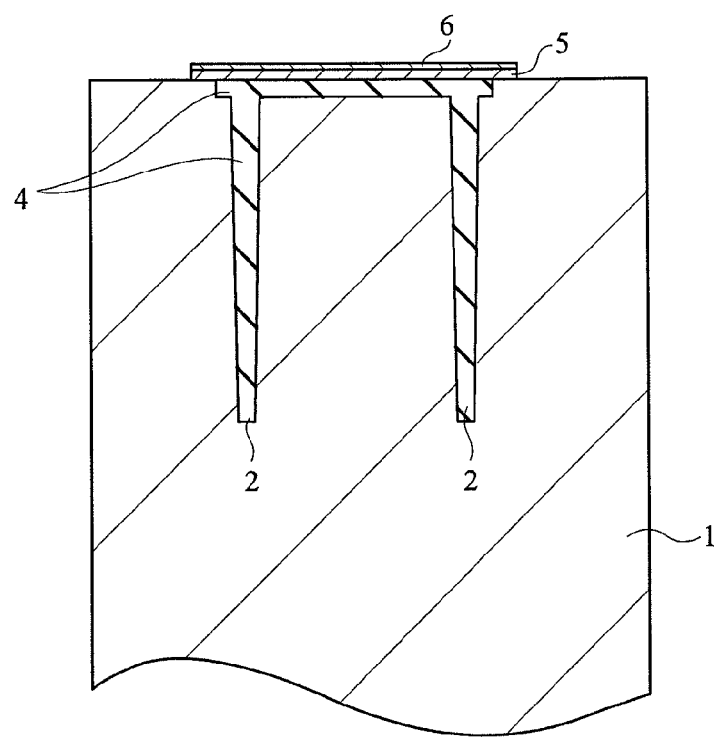
FIG. 7 is a cross sectional view showing a manufacturing step (continued from FIG. 6) of the semiconductor wafer (main parts) according to the first embodiment of the present invention.

Next, as shown in FIG. 6, at the same time with forming the gate electrode film 5 of a polycrystalline silicon film on the isolation region, a polycrystalline silicon film is formed on the field part 3 to form the through-hole electrode. Moreover, as shown in FIG. 7, the metal film 6 of tungsten (W) and the like is formed on the top of the gate electrode film 5. The series of processes are performed at the same time in the usual LSI manufacturing process.

Figure 8:
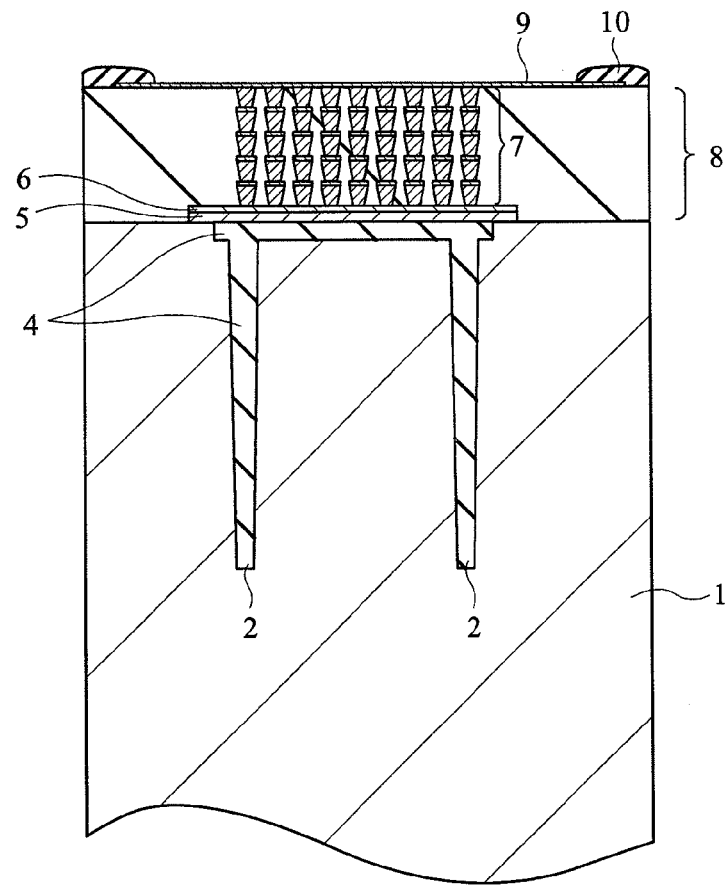
FIG. 8 is a cross sectional view showing a manufacturing step (continued from FIG. 7) of the semiconductor wafer (main parts) according to the first embodiment of the present invention.

Next, as shown in FIG. 8, a plurality of the columnar wiring vias 7 in columnar shape are formed so as to electrically connect the external connection electrode 9 of an Al electrode and the like and the metal film 6 that is a foundation thereof. The series of processes are also performed at the same time in the LSI manufacturing process.

Meanwhile, the columnar wiring via 7 is conventionally described as an embodiment that is electrically connected to the external connection electrode 9 of an Al electrode and the like, which is connected by wire bonding and the like. However, this is premised on an LSI to which an existing wiring design is provided but this is based on a design concept where a through-hole electrode is formed so as to electrically connect external connection electrodes conventionally connected by wire bonding and the like. However, in an LSI to which a specific design which is premised on connection via through-hole electrodes from the back surface side is provided, it is sufficient as long as the metal film 6 that is a foundation of the columnar wiring vias 7 is electrically connected to a global wiring part in the midst of the stacked wiring part which is conventionally wire-connected to the external connection electrode 9. It is needless to say that embodiments will be different from each other according to respective morphologies of design of LSI.

FIG. 9 to FIG. 17 are cross sectional views showing respective manufacturing steps of a semiconductor device using the semiconductor wafer shown in FIG. 8. In other words, a manufacturing process of the semiconductor device in which through-hole electrodes are formed to the semiconductor device according to the present invention.

Figure 9:
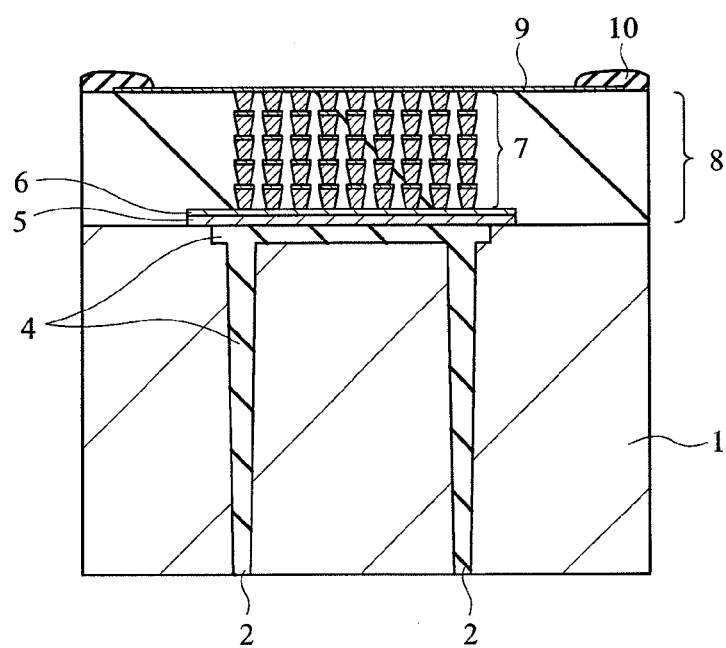
FIG. 9 is a cross sectional view showing a manufacturing step of a semiconductor device (main parts) using the semiconductor wafer according to the first embodiment of the present invention.

First, for the semiconductor device according to the present embodiment, the wafer is mechanically grinded from its back surface to expose the above deep trench 2 as shown in FIG. 9. After that, a finishing process such as dry polishing may be implemented. The final thickness of the wafer is about 30 to 50 μm but it can be changed as needed according to the type of product. Especially, when thinning the wafer down to less than about 50 μm, it may be performed with a holding member such as glass previously attached. In this case, it may pose a great warpage by the internal stress of the wafer itself if it is performed to the wafer alone. Therefore, it is required to make the flatness high while transporting and processing of the manufacturing steps.

Figure 10:
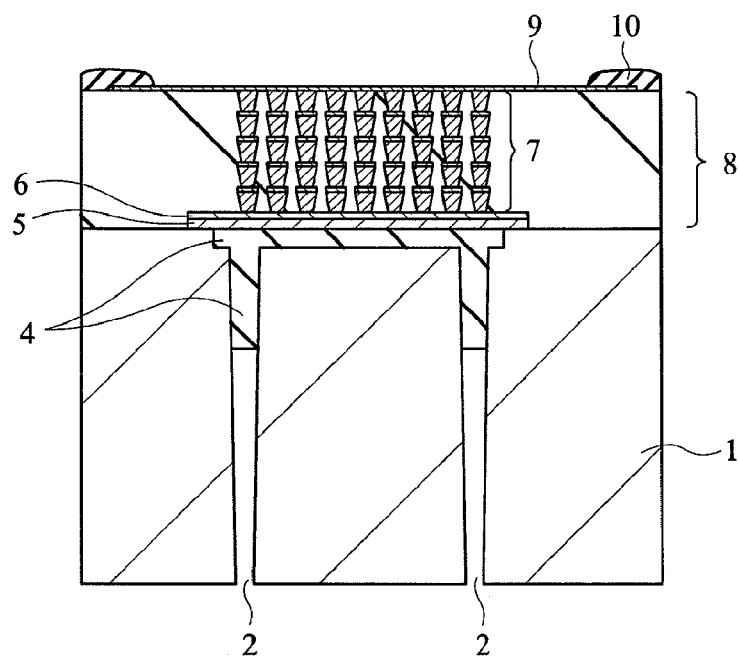
FIG. 10 is a cross sectional view showing a manufacturing step (continued from FIG. 9) of a semiconductor device (main parts) using the semiconductor wafer according to the first embodiment of the present invention.
Figure 11:
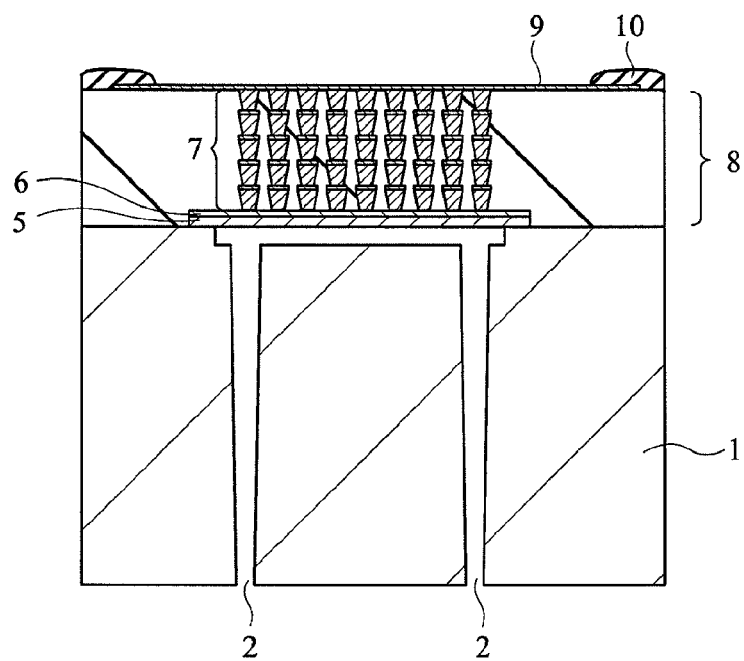
FIG. 11 is a cross sectional view showing a manufacturing step (continued from FIG. 10) of a semiconductor device (main parts) using the semiconductor wafer according to the first embodiment of the present invention.

Next, as shown in FIG. 10, the insulating material 4 of an oxide film and the like buried in the deep trench 2 is dissolved through wet etching and the like. The buried insulating material 4 is exposed from the back surface of the wafer by the wafer thinning. Therefore, dissolution of the insulating material 4 progresses from the back surface of the wafer. By dissolving the whole buried insulating material 4, as shown in FIG. 11, a silicon piece inside the deep trenches 2 is floated ultimately.

Figure 12:
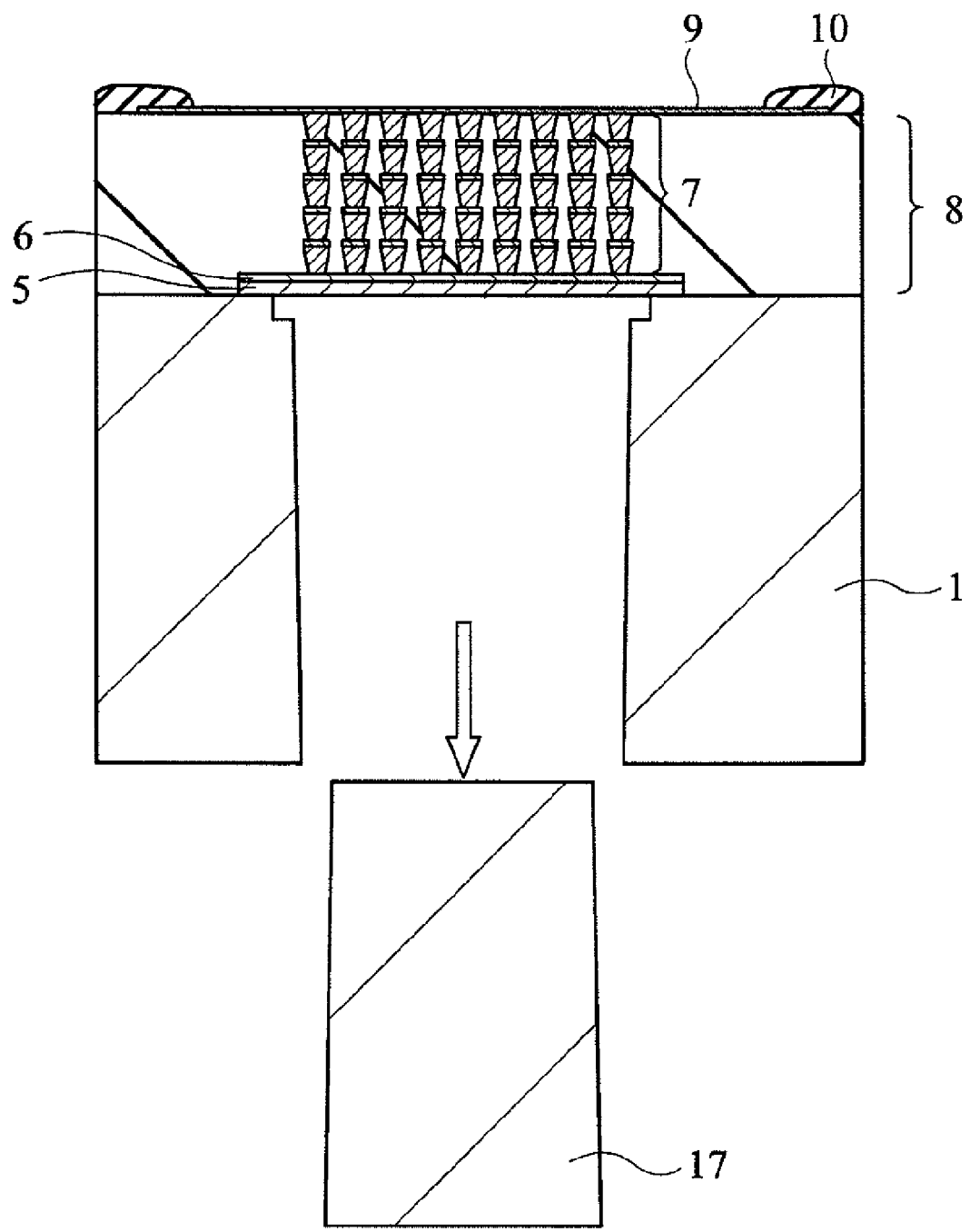
FIG. 12 is a cross sectional view showing a manufacturing step (continued from FIG. 11) of a semiconductor device (main parts) using the semiconductor wafer according to the first embodiment of the present invention.
Figure 13:
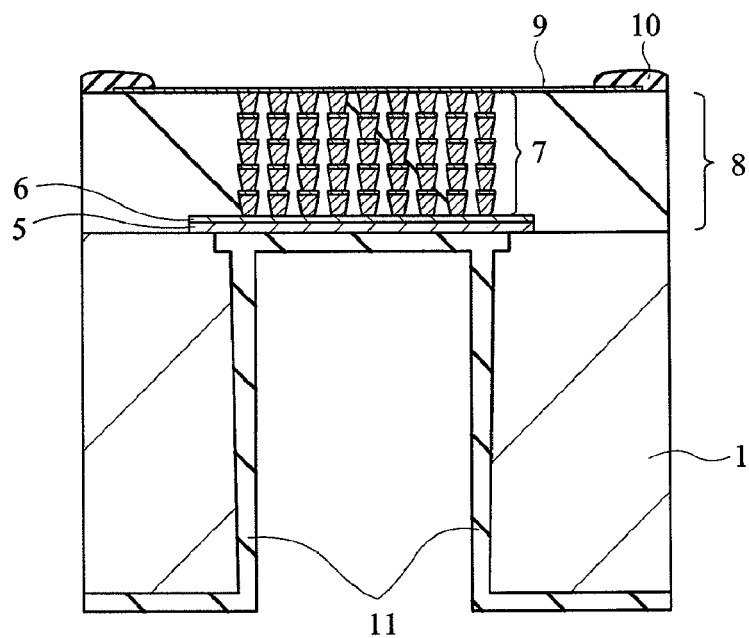
FIG. 13 is a cross sectional view showing a manufacturing step (continued from FIG. 12) of a semiconductor device (main parts) using the semiconductor wafer according to the first embodiment of the present invention.

Further, as shown in FIG. 12, in a washing step after the wet etching, by dropping the floating silicon piece 17, a silicon hole (silicon hole part) is formed without performing a silicon process by conventional dry etching. On sidewalls of the silicon hole, a thermal oxide film is formed through various thermal processes in the manufacturing process of LSI. However, since electrical insulation is needed including on the back surface of the wafer, as shown in FIG. 13, an insulating film 11 is formed again on the back surface of the wafer including the sidewalls and the bottom part of the silicon hole. Note that, when the wafer is fixed to a holding member such as glass by an adhesive and the like, it is required to form the film at a low temperature under the upper temperature limit of the adhesive fixing the glass (e.g., under 200° C.).

Figure 14:
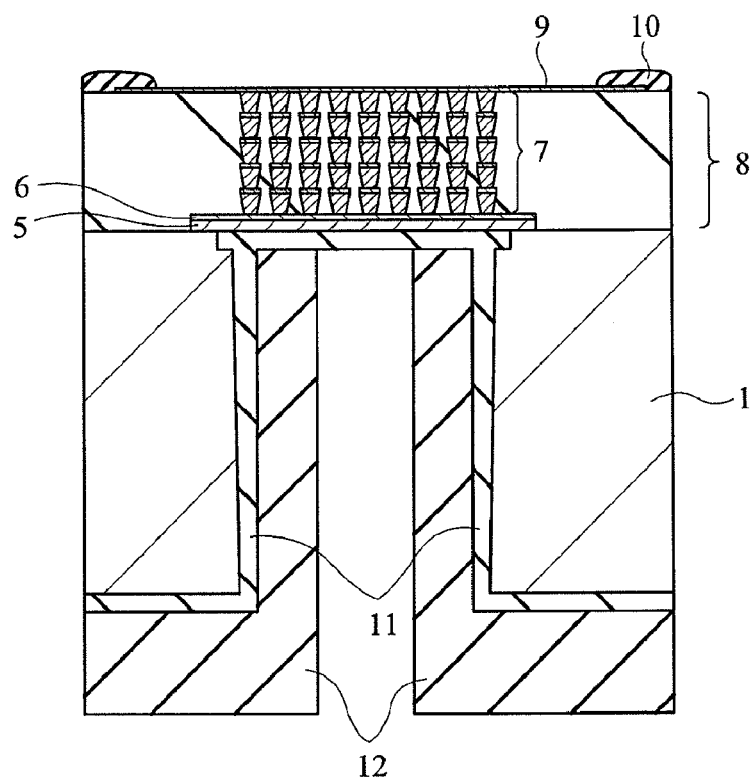
FIG. 14 is a cross sectional view showing a manufacturing step (continued from FIG. 13) of a semiconductor device (main parts) using the semiconductor wafer according to the first embodiment of the present invention.
Figure 15:
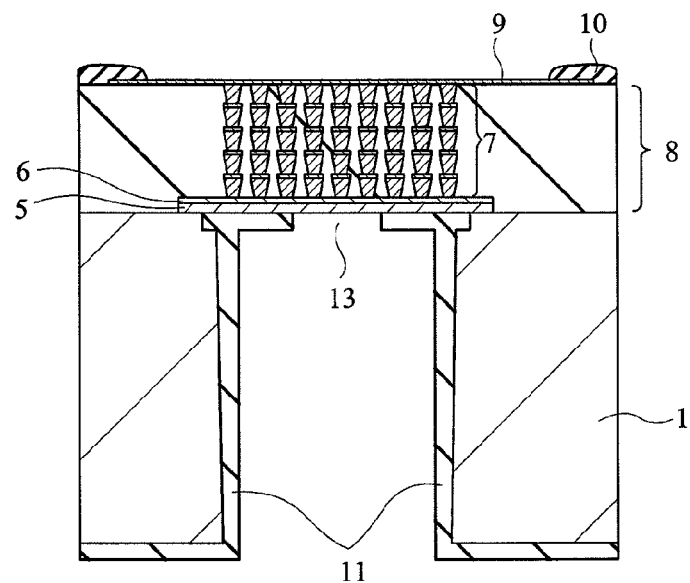
FIG. 15 is a cross sectional view showing a manufacturing step (continued from FIG. 14) of a semiconductor device (main parts) using the semiconductor wafer according to the first embodiment of the present invention.

Next, as shown in FIG. 14, only the insulating film on the bottom part of the silicon hole is removed. To form an electrical contact part, a hole-filling photolithography is performed and the back surface of the wafer and the sidewalls of the silicon hole are coated by a resist mask 12 as shown in the figure. When the photolithography process is performed from the back surface of the wafer, an alignment mark which can be recognized from the back surface is needed. For this, by forming the above deep trenches on, for example, a specific scribe area, the exposed cross-sectional shape of the trench after thinning can be used as recognition marks. In this manner, it is possible to perform photolithography on the back surface of the wafer without particular kind of photolithography equipment to recognize alignment marks on a circuit surface of the wafer by diverting conventional equipment. By performing wet etching process while coated by the resist mask 12, as shown in FIG. 15, the insulating film 11 formed on the bottom part is dissolved so as to form a contact part 13.

To remove the insulating film 11 on the bottom part, dry etching process or solution processing by laser may be used other than the above wet etching process. When using laser, although the gate electrode film 5 of a polycrystalline Si film is dissolved at the same time, the depth of laser processing can be controlled by composing the metal film 6 above the gate electrode film 5 by a high-melting point metal such as tungsten (W). In the etching process, the thickness of the insulating film formed on the bottom part of the silicon hole is sufficiently thin compared to that formed on the flat back surface of the wafer. Therefore, only the insulating film 11 on the bottom part may be dissolved by adequately controlling the etching rate without using photolithography process. Although the insulating film 11 formed on the sidewalls is removed similarly to that on the bottom part, it is possible to maintain the dielectric strength voltage without providing the resist mask 12 because the insulating film is overcoated again through CVD on the thermal oxide film originally formed in the manufacturing process of LSI.

Figure 16:
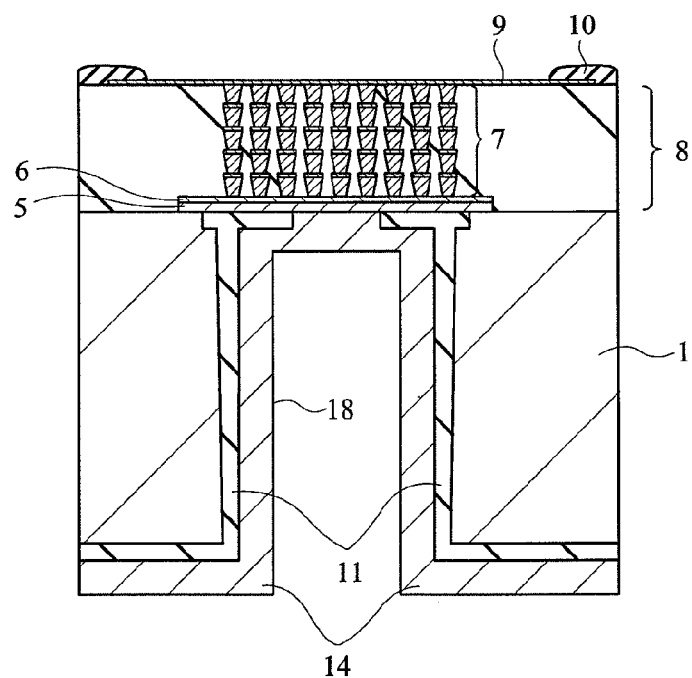
FIG. 16 is a cross sectional view showing a manufacturing step (continued from FIG. 15) of a semiconductor device (main parts) using the semiconductor wafer according to the first embodiment of the present invention.

Finally, as shown in FIG. 16, a seed layer to perform electrolytic plating is formed. After that, a through-hole electrode (back electrode) 18 is formed of the seed layer and an electrolytic plating layer 14 through electrolytic plating process. Here, to form the seed layer, sputtering or metal CVD is used, and an Au seed layer is formed if a gold plating process is implemented on an upper layer of a barrier film of Cr, Ti, TiN and the like. Electrolytic plating after that does not require plate filling inside the hole, and has only to form a thin-layer plating with a thickness of 3 to 5 μm, thereby finishing the process in a short plating time.

Figure 17:
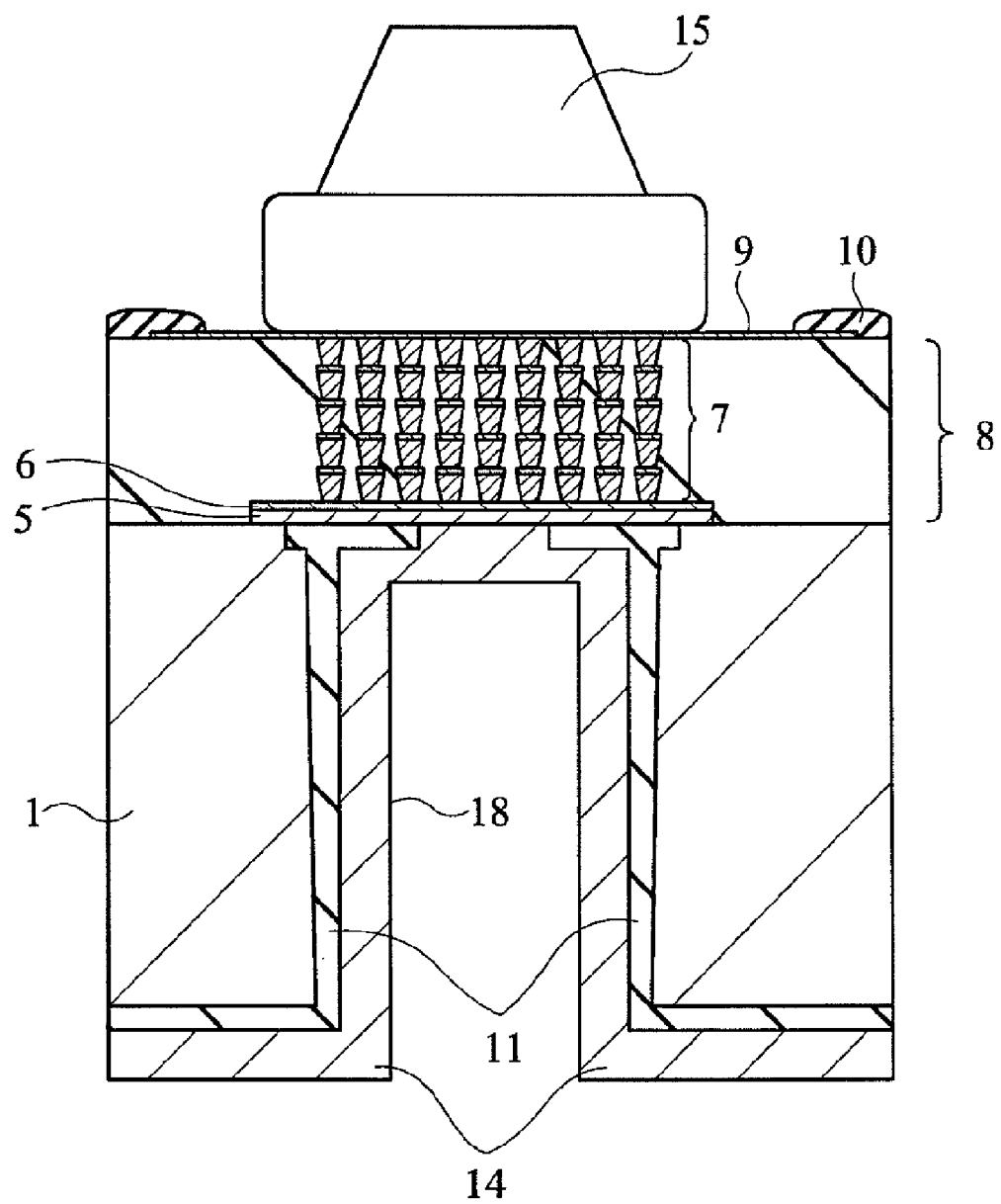
FIG. 17 is a cross sectional view showing a manufacturing step (continued from FIG. 16) of a semiconductor device (main parts) using the semiconductor wafer according to the first embodiment of the present invention.

After that, as shown in FIG. 17, a gold stud bump 15 is formed as a bump on the external connection electrode 9 (Al electrode and the like). The stud bump 15 can be formed after dicing into the chip size as the conventional process. The stud bump 15 can be previously formed in the stage of the initial product wafer, i.e., the stage of the semiconductor wafer shown in FIG. 1.

Second Embodiment

Figure 18A:
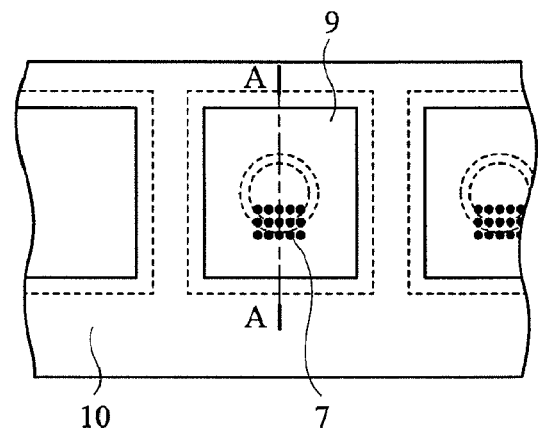
FIG. 18A is a plan view showing main parts of a semiconductor wafer according to a second embodiment of the present invention.
Figure 18B:
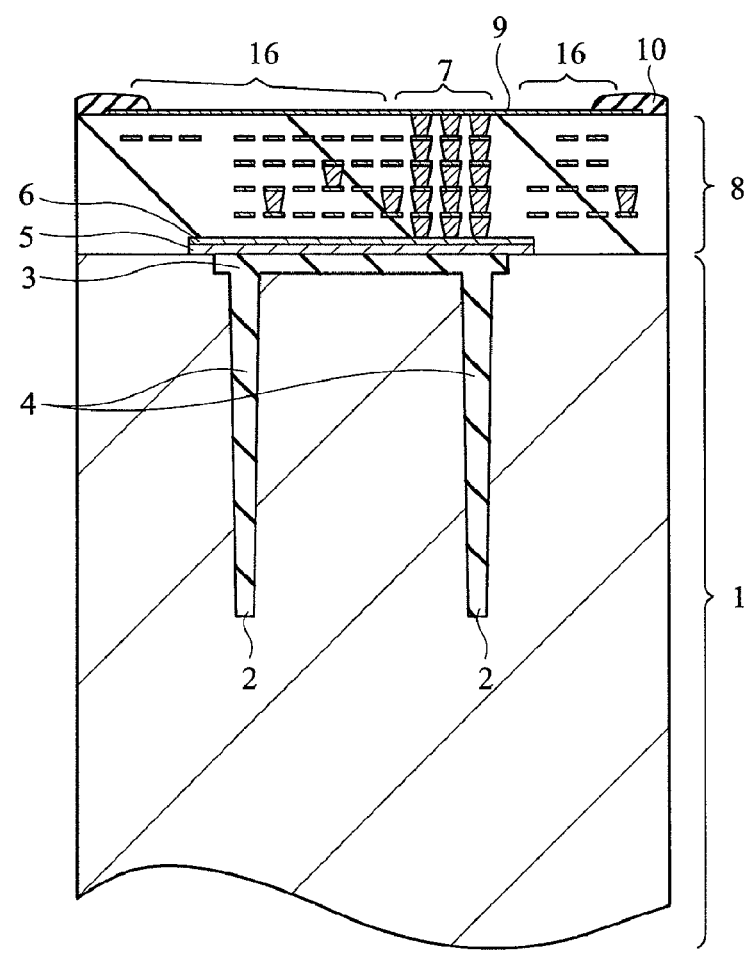
FIG. 18B is a cross sectional view of the semiconductor wafer shown in FIG. 18A cut along the cutting-plane line A-A.
Figure 19A:
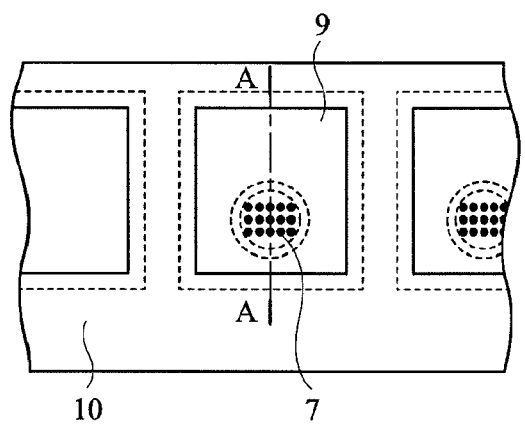
FIG. 19A is a plan view showing main parts of the semiconductor wafer (modification example) according to the second embodiment of the present invention.
Figure 19B:
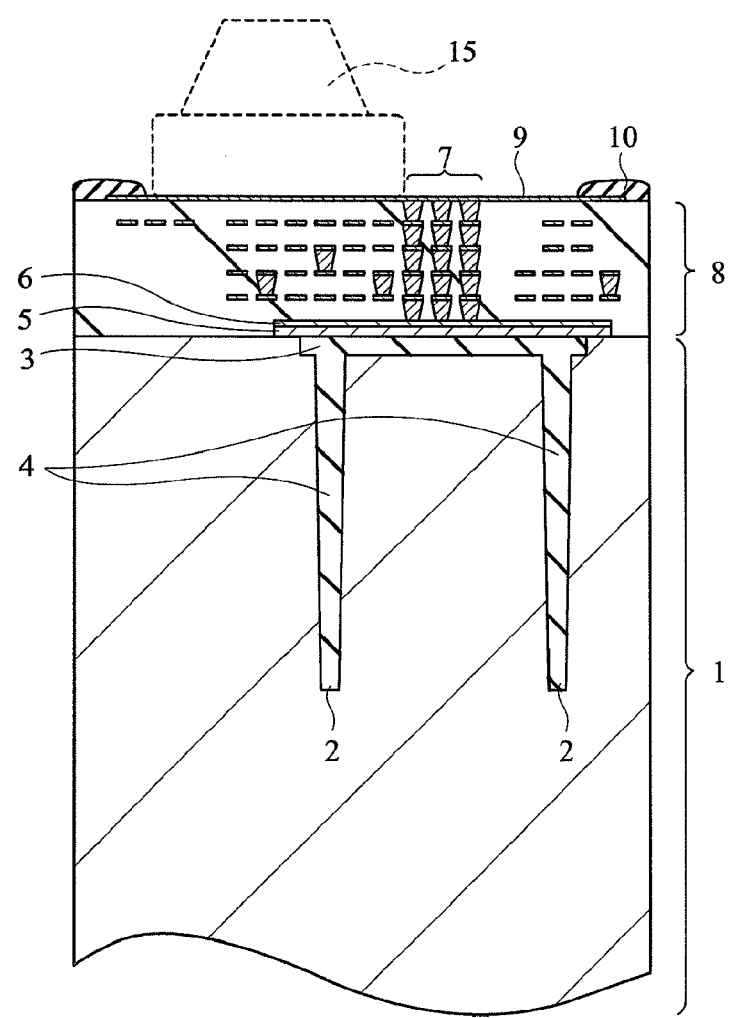
FIG. 19B is a cross sectional view of the semiconductor wafer shown in FIG. 19A cut along the cutting-plane line A-A.

FIG. 18A and FIG. 19A are plan views showing main parts of a semiconductor wafer of a second embodiment of the invention and FIG. 18B and FIG. 19B are cross-sectional views of FIG. 18A and FIG. 19A cut along the cutting-plane line A-A.

The semiconductor wafer of the present embodiment has a structure where I/O cell wirings 16 are arranged just under the external connection electrode (Al electrode and the like) 9 as shown in FIG. 18. Upon accelerating shrinkage of chip size, it is effective to put in the I/O cell wirings 16 also under an electrode pad. In the cross-sectional structure of FIG. 1, the I/O cell wiring structure is not provided under the electrode pad and it is structured only by the columnar wiring vias 7 electrically connecting between the metal film 6 and the external connection electrode 9 formed on an upper surface of the deep trench 2. In contrast, under the electrode pad, in addition to the columnar wiring vias 7 electrically connecting the metal film 6 and the external connection electrode 9 formed on the upper surface of the deep trench 2, the I/O cell wirings 16 of an I/O wiring, a power wiring, a ground wiring and the like in the LSI are consolidated in the structure here.

Note that, as described above, also in the present embodiment the design concept where the through-hole electrode is formed based on the existing wiring design of LSI is provided. Therefore, although the columnar wiring vias 7 electrically connected with the external connection electrode 9 are configured, if a specific design premised on a connection by through-hole electrodes from the back surface side is provided to the LSI, it is sufficient as long as the metal film as the foundation of the columnar wiring vias 7 is electrically connected to the global wiring part in the midst of the multi-layer wiring which is conventionally wire-connected to the external connection electrode 9. It is needless to say that the embodiments thereof will be different from each other according to respective morphologies of design of LSI.

FIG. 19 shows a structure where the gold stud bump 15 is formed on the external connection electrode in the stage of wafer to form the through-hole electrode. Although the stud bump 15 is usually formed at the center of the electrode pad, it is preferable to bond the stud bump 15 avoiding forming it on the area just below the columnar wiring vias 7 where the potential of stress generation due to the mechanical load upon forming the stud bump is large.

Third Embodiment

FIG. 20 to FIG. 26 are plan views and cross-sectional views showing respective manufacturing steps of a semiconductor device using a semiconductor wafer of a third embodiment of the present invention.

Figure 20:
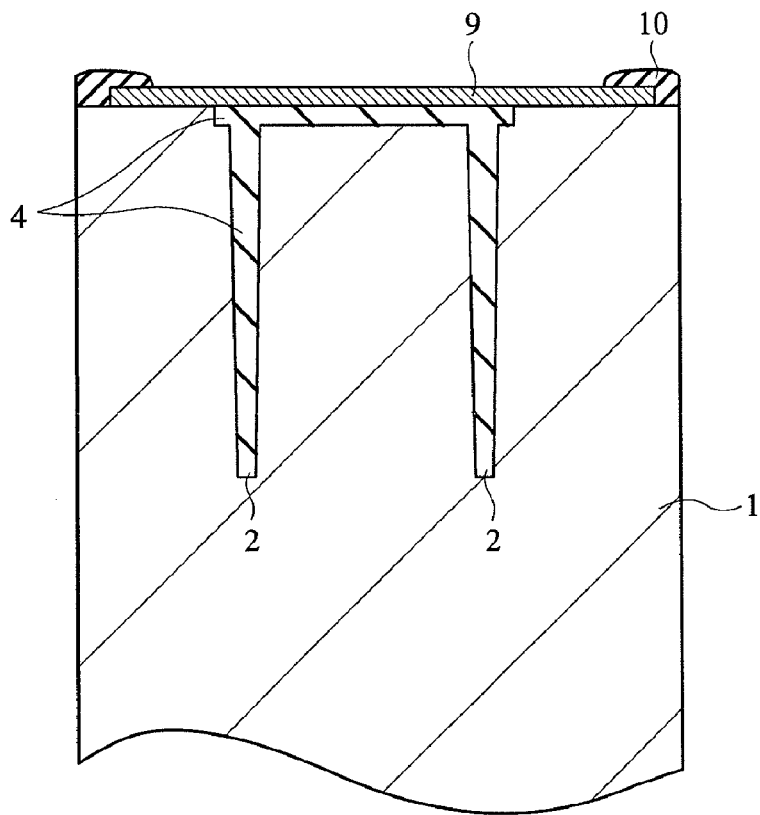
FIG. 20 is a cross sectional view showing a manufacturing step of a semiconductor device using a semiconductor wafer according to a third embodiment of the present invention.
Figure 21:
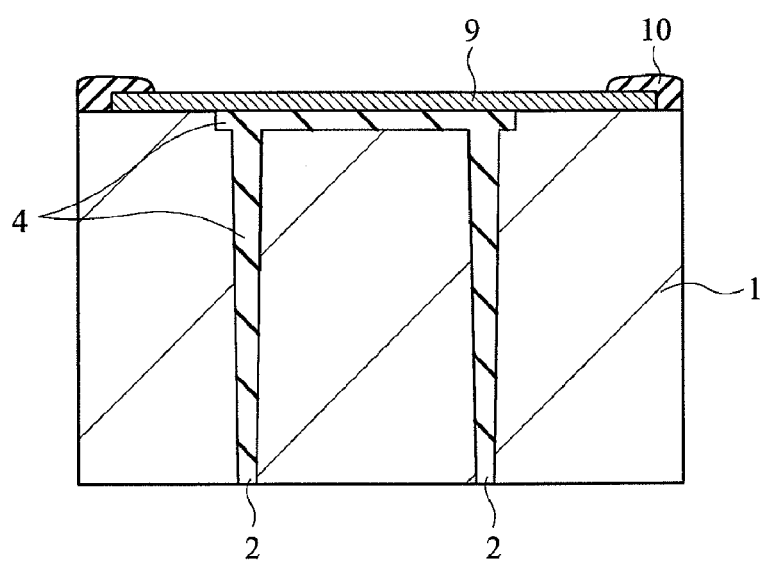
FIG. 21 is a cross sectional view showing a manufacturing step (continued from FIG. 20) of the semiconductor device using the semiconductor wafer according to the third embodiment of the present invention.
Figure 22:
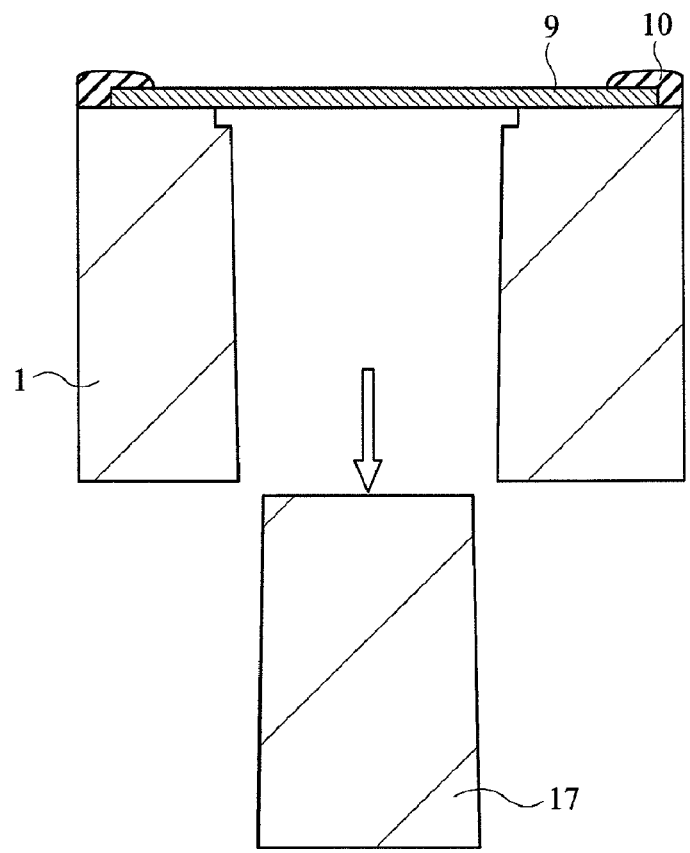
FIG. 22 is a cross sectional view showing a manufacturing step (continued from FIG. 21) of the semiconductor device using the semiconductor wafer according to the third embodiment of the present invention.
Figure 23:
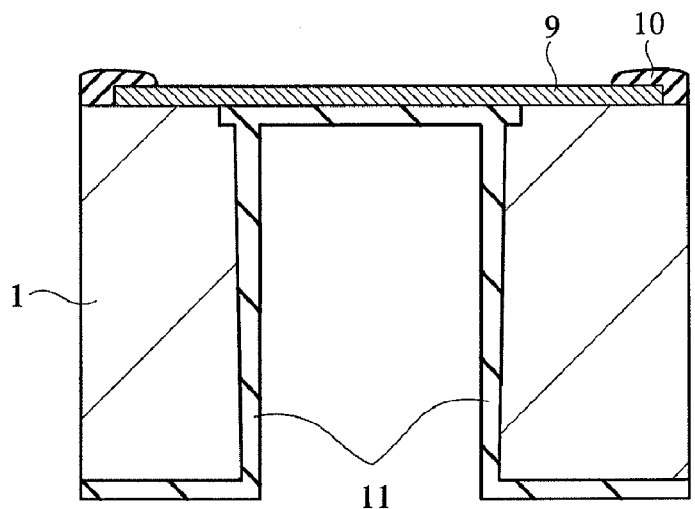
FIG. 23 is a cross sectional view showing a manufacturing step (continued from FIG. 22) of the semiconductor device using the semiconductor wafer according to the third embodiment of the present invention.
Figure 24A:
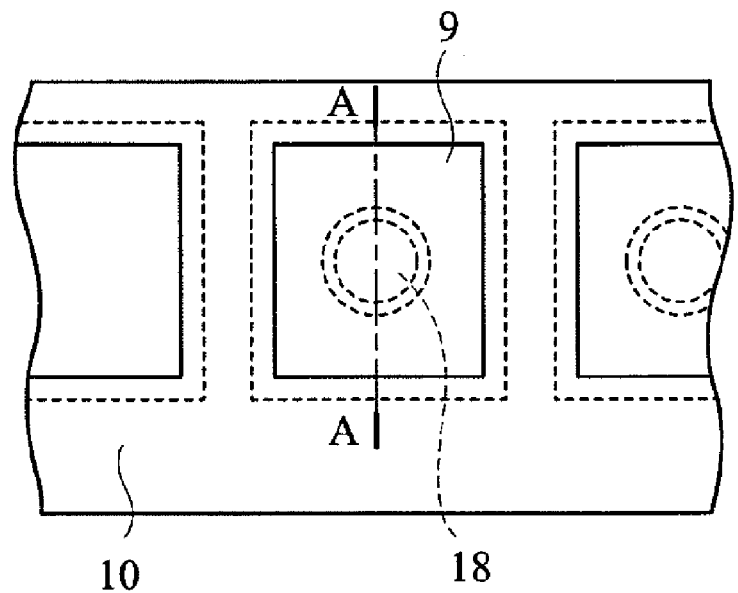
FIG. 24A is a plan view showing a manufacturing step (continued from FIG. 23) of main parts of the semiconductor device using the semiconductor wafer according to the third embodiment of the present invention.
Figure 24B:
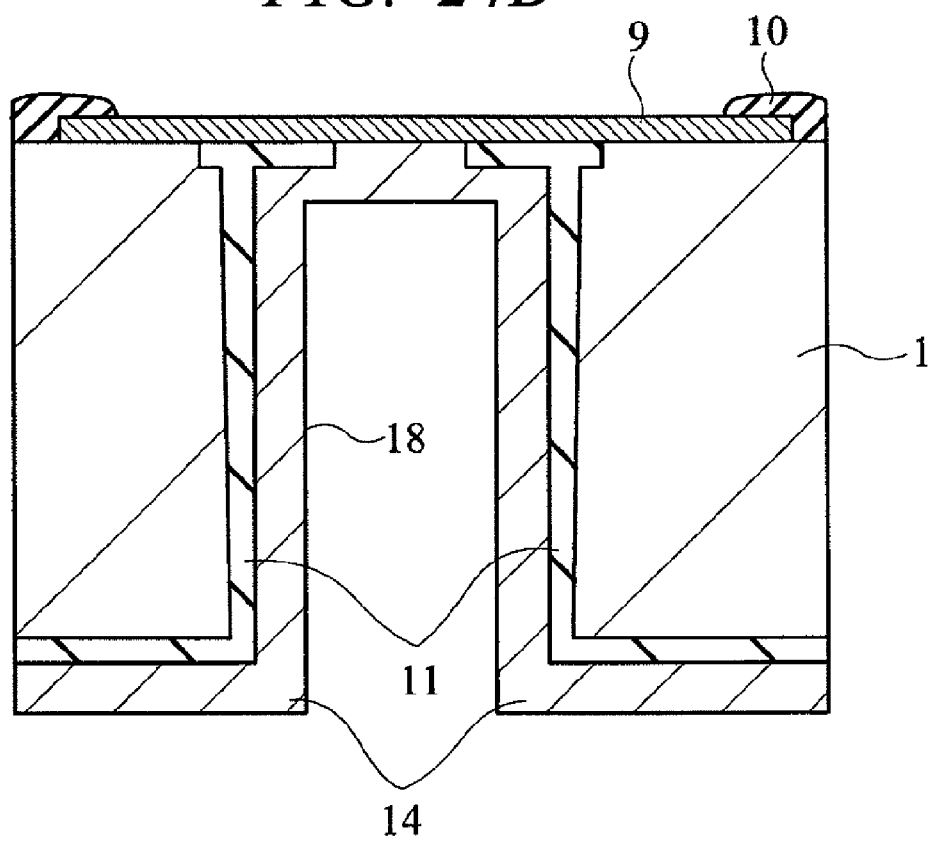
FIG. 24B is a cross sectional view of the semiconductor wafer shown in FIG. 24A cut along the cutting-plane line A-A.

In the present embodiment, a method of manufacturing an interposer chip by forming a through-hole electrode similarly to the above first embodiment on, for example, a wafer for interposer having the external connection electrodes 9 of one-layer wiring on the front/back sides is described. As shown in FIG. 20, the series of processes of: back grinding of silicon wafer (FIG. 21); dropping the silicon piece (FIG. 22); forming the insulating film 11 (FIG. 23); forming the seed layer and the electrolytic plating layer 14 (FIG. 24); and forming the stud bump 15 (FIG. 25, FIG. 26) with respect to the silicon wafer with the deep trench 2 and the external connection electrode 9 formed thereon is same as that of the product LSI described in the first embodiment. However, as shown in FIG. 24, the forming part of the gold stud bump 15 is configured only by the external connection electrode 9 and a thin-layer insulating film. Thus, damage may posed due to the load of bonding when forming the stud bump 15.

Figure 25:
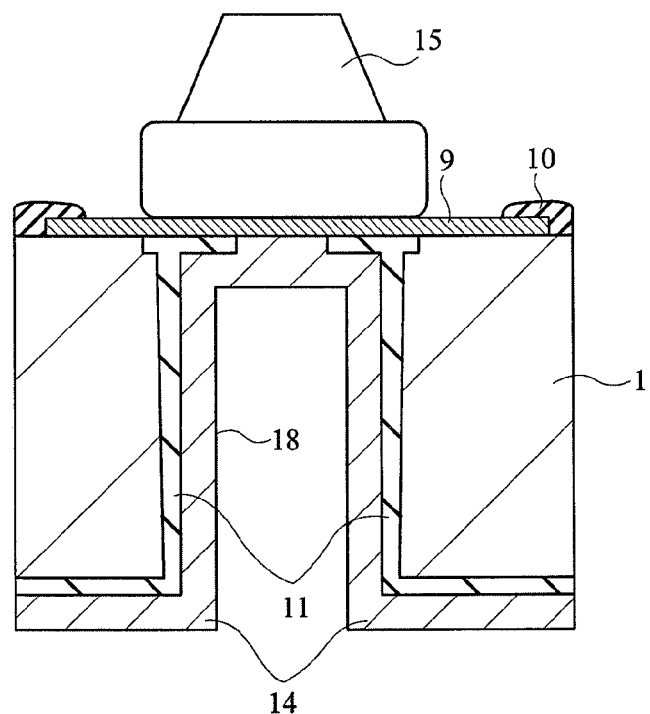
FIG. 25 is a cross sectional view showing a manufacturing step (continued from FIG. 24) of the semiconductor device using the semiconductor wafer according to the third embodiment of the present invention.
Figure 26:
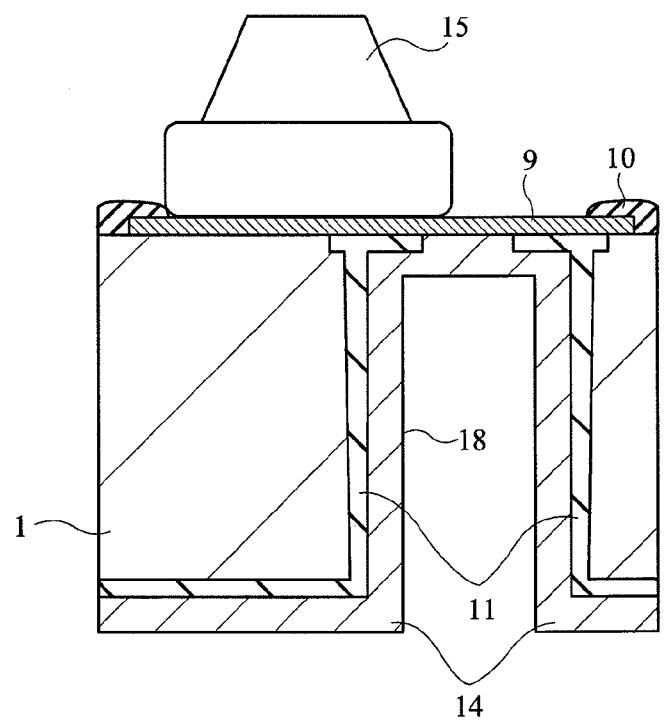
FIG. 26 is a cross sectional view showing a manufacturing step (a modification example continued from FIG. 24) of the semiconductor device using the semiconductor wafer according to the third embodiment of the present invention.

Therefore, as shown in FIG. 25, by devising a catalyser to accelerate the growth of the plating on the bottom part of the through-hole electrode 18 of the surface part of the back surface, a plating growth in which the seed layer and the electrolytic plating layer 14 become thick only on the bottom of the hole is made to improve the strength of electrode. Alternatively, as shown in FIG. 26, it is preferable to make the stress decreased by forming the gold stud bump 15 offsetting toward one side. The amount of offset in this case is more than an extent that the center of the stud bump 15 is not overlapping. Still alternatively, the gold stud bump 15 may be previously formed on the necessary external connection electrode 9 in a stage of wafer level with the wafer before thinned by mechanical grinding. In this manner, in the formation of the interposer chip, damage generation when forming the bump due to mechanical load can be avoided.

Figure 27:
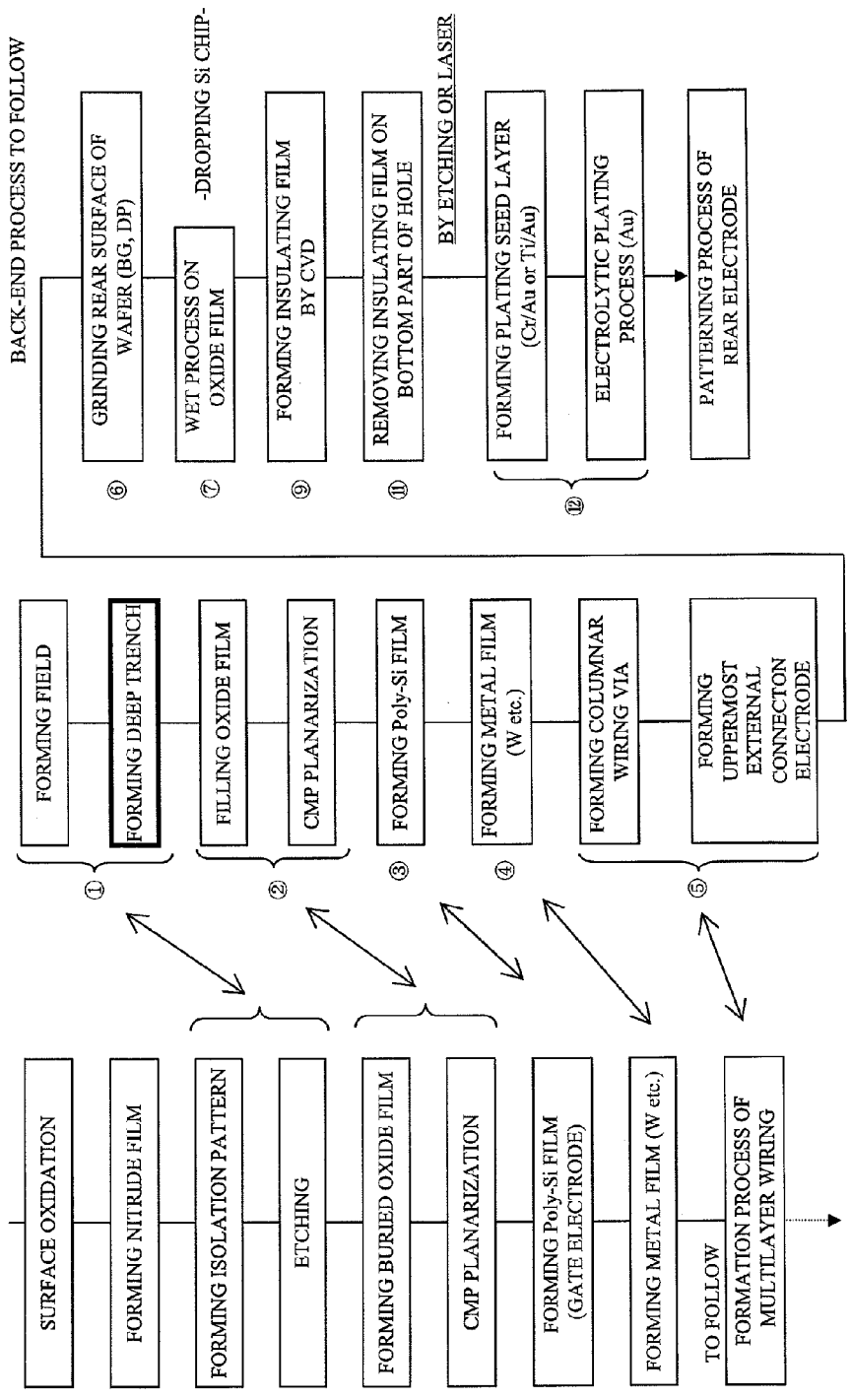
FIG. 27 is a diagram showing a comparison of manufacturing processes of LSI according to the first to third embodiments and an ordinary manufacturing process of LSI.

Comparison of the First to Third Embodiments and a Usual Manufacturing Process of LSI FIG. 27 shows a comparison of manufacturing processes of LSI according to the above first to third embodiments and a usual manufacturing process of LSI.

In the manufacturing processes of LSI according to above-described first to third embodiments, as shown in FIG. 27, the manufacturing process of a semiconductor wafer is performed as the order of: forming a field; forming a deep trench; filling an oxide film; CMP planarizing; forming a poly-Si film; forming a metal film; forming a columnar wiring via; and forming an external connection electrode of the uppermost layer. The following manufacturing process (back-end process) of a semiconductor device using the semiconductor wafer is performed as the order of: grinding on the back surface of the wafer (BG, DP); wet processing of oxide film (dropping the silicon piece); forming an insulating film (CVD); removing the insulating film on the bottom part of the hole (by etching or laser); forming a plating seed layer; electrolytic plating process; and patterning process of back electrode.

As shown in FIG. 27, a feature lies in that the formation of deep trench corresponds to the formation process of isolation pattern, and all the following process can be realized corresponding to the steps of usual manufacturing process of LSI with few new processes used. Dry etching process to form the through-hole electrode after thinning the wafer in the back-end process becomes unnecessary by forming the deep trench in the manufacturing step of LSI previously. Therefore, without developing new equipment accommodating the large-sized wafers, it is possible to provide the formation of through-hole electrodes accommodating the large-sized wafers at low cost and easy way in the range of conventional wet etching process and plating process technologies.

Electrical Connection Configuration of a Chip According to the First to Third Embodiments FIG. 28 and FIG. 29 are diagrams showing a method for electrically connecting an LSI chip having the through-hole electrode and gold stud bump and the interposer chip formed according to the above first to third embodiments.

As shown in FIG. 28, the LSI chip (formed in the above first embodiment) 21 having the through-hole electrode formed therein is arranged to the lower level, and the interposer chip (formed in the above third embodiment) 22 is arranged to the upper level. The gold stud bump 15 formed on the interposer chip 22 of the upper level is pressed into the hole part of the through-hole electrode 18 formed on the LSI chip 21 of the lower level. Then the gold stud bump 15 is plastically deformed and filled inside the through-hole electrode 18. By mechanically caulking this, as shown in FIG. 29, the LSI chip 21 and the interposer chip 22 being stacked can be electrically connected.

In this manner, according to the present embodiment, it is possible to electrically connect the LSI chip 21 having the through-hole electrode 18 and stud bump 15 and the interposer chip 22 by only applying pressure at, for example, room temperature when stacking and connecting the LSI chip 21 and the interposer chip 22. It is very simple compared to the conventional method of metal junction between bumps where stacked chips are heated to 200 to 300° C. to connect, and so environmental load can be reduced.

Effects of First to Third Embodiments

As described above, according to the above first to third embodiments, the following effects can be obtained.

(1) A dry etching process on silicon and interlayer insulating films and the like from the back surface side of the thinned wafer is eliminated by forming the deep trench 2 at a position to form the through-hole electrode at the stage of manufacturing process of LSI. It makes possible to form through-hole electrodes on the large-sized wafer of such as 12 inch, so that the manufacturing cost can be significantly reduced.

(2) An etching process to reach the external connection electrode 9 of the surface layer of the interlayer insulating film part formed to be multilayered and a thick film is eliminated. It is possible to avoid the process stopping short of the external connection electrode part which is difficult to control depending on the difference in process rates of the interlayer insulating film part, so that the process difficulty is decreased and the electrical conduction between the front and back electrodes in a process with significantly short TAT.

(3) Damages of the through-hole electrode part posed by mechanical load generated when forming the bump after forming the through-hole electrode can be avoided by forming the stud bump 15 in advance at the wafer level. At the same time, the process difficulty can be significantly decreased by using the stud bump 15 as a means for stopping processing in etching and laser processing.

(4) A semiconductor wafer which enables formation of through-hole electrodes at low coat and in short TAT even for the large-sized wafers, a structure of a semiconductor device and a method of manufacturing the same can be provided in the case of forming a through-hole electrode from the back surface of the wafer.

In the foregoing, the invention made by the inventors of the present invention has been concretely described based on the embodiments. However, it is needless to say that the present invention is not limited to the foregoing embodiments and various modifications and alterations can be made within the scope of the present invention.

A semiconductor wafer and a technology of manufacturing a semiconductor according to the present invention is applicable to a structure of through-hole electrode formed inside a plurality of chips which are stacked three-dimensionally and a method of manufacturing the same.

What is claimed is:

1. A method of manufacturing a semiconductor device on a semiconductor wafer comprising:
   a hollow tubular trench formed at a position to form a through-hole electrode of a silicon wafer;
   an insulating member buried inside the trench and on an upper surface of the silicon wafer surrounded by the trench;
   a conducting film formed on an upper surface of the insulating member;
   a conducting member formed on the conducting film; and
   an external connection electrode formed electrically connected to the conducting film via the conducting member,
   the method comprising steps of:
   thinning the semiconductor wafer from its back surface and exposing the insulating member buried inside the trench;
   dissolving the insulating member inside and on an upper surface of the trench by wet etching; and
   forming a silicon hole part reaching the conducting film by dropping a silicon piece of an inner surface of the trench.

2. The method of manufacturing a semiconductor device according to claim 1 further comprising the steps of:
   forming an insulating film in an inner surface of the silicon hole part and on a whole surface of the back surface of the semiconductor wafer;
   exposing the conducting film by removing the insulating film on a bottom part of the silicon hole part; and
   forming a seed layer for electrolytic plating and an electrolytic plating film on the inner surface of the silicon hole part and a predetermined area of the back surface of the semiconductor wafer so as to form a through-hole electrode electrically connected to the external connection electrode.

3. The method of manufacturing a semiconductor device according to claim 1,
   wherein the steps from exposing the insulating member to forming the silicon hole part are performed with the semiconductor wafer adhered to a holding member, and the semiconductor wafer is separated from the holding member after finishing manufacturing.

4. A method of manufacturing a semiconductor wafer comprising the steps of:
   forming a hollow tubular trench at a position to form a through-hole electrode of a silicon wafer;
   burying an insulating member inside the trench and on an upper surface of the silicon wafer surrounded by the trench;
   forming a conducting film on an upper surface of the insulating member;
   forming a conducting member on an upper surface of the conducting film;
   forming an external connection electrode electrically connected to the conducting film via the conducting member;
   thinning the silicon wafer from its back surface and exposing the insulating member buried inside the trench;
   dissolving the insulating member inside and on an upper surface of the trench by wet etching;
   forming a silicon hole part reaching the conducting film by dropping a silicon piece of an inner surface of the trench;
   forming an insulating film in an inner surface of the silicon hole part and on a surface of the back surface of the silicon wafer;
   exposing the conducting film by removing the insulating film only on a bottom part of the silicon hole part; and
   forming a seed layer for electrolytic plating and an electrolytic plating film on the inner surface of the silicon hole part and a predetermined area of the back surface of the silicon wafer so as to form a through-hole electrode electrically connected to the external connection electrode.

5. A method of manufacturing a semiconductor wafer comprising the steps of:
   forming a hollow tubular trench at a position to form a through-hole electrode of a silicon wafer;
   burying an insulating member inside the trench and on an upper surface of the silicon wafer surrounded by the trench;
   forming a conducting film on an upper surface of the insulating member;
   forming a conducting member on an upper surface of the conducting film;
   forming an I/O wiring, a power wiring, or a ground wiring in an LSI electrically connected to the conducting film via the conducting member;
   thinning the silicon wafer from its back surface and exposing the insulating member buried inside the trench;
   dissolving the insulating member inside and on an upper surface of the trench by wet etching;
   forming a silicon hole part reaching the conducting film by dropping a silicon piece of an inner surface of the trench;
   forming an insulating film in an inner surface of the silicon hole part and on a whole surface of the back surface of the silicon wafer;
   exposing the conducting film by removing the insulating film only on a bottom part of the silicon hole part; and
   forming a seed layer for electrolytic plating and an electrolytic plating film on the inner surface of the silicon hole part and a predetermined area of the back surface of the silicon wafer so as to form a through-hole electrode electrically connected to the external connection electrode.

6. The method of manufacturing a semiconductor device according to claim 2 comprising the steps of:
   dicing the semiconductor wafer having the through-hole electrode formed therein into a size of each chip; and
   forming a gold bump on the external connection electrode of each of the diced chips,
   wherein, to stack a second chip having the gold bump on a first chip having the through-hole electrode, the gold bump of the second chip is pressed into the inside of through-hole electrode of the first chip and mechanically caulked so as to electrically connect between the stacked chips.

* * * * *

UNITED STATES PATENT AND TRADEMARK OFFICE
CERTIFICATE OF CORRECTION

PATENT NO.       : 7,897,509 B2
APPLICATION NO.  : 12/823913
DATED            : March 1, 2011
INVENTOR(S)      : Tanaka et al.

It is certified that error appears in the above-identified patent and that said Letters Patent is hereby corrected as shown below:

Title Page:

In the bibliographic data at Item (73) Assignee,

"Renesas Electronics Corp., Tokyo (JP)"

should read,

--Renesas Electronics Corporation, Kanagawa (JP)--

Signed and Sealed this
Twenty-seventh Day of September, 2011

David J. Kappos
*Director of the United States Patent and Trademark Office*